(12) United States Patent
Rhie

(10) Patent No.: US 7,910,435 B2
(45) Date of Patent: Mar. 22, 2011

(54) METHOD OF MANUFACTURING A SEMICONDUCTOR DEVICE HAVING A CHANNEL EXTENDING VERTICALLY

(75) Inventor: Hyoung-Seub Rhie, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 257 days.

(21) Appl. No.: 12/349,370

(22) Filed: Jan. 6, 2009

(65) Prior Publication Data
US 2009/0155974 A1   Jun. 18, 2009

Related U.S. Application Data

(62) Division of application No. 11/582,750, filed on Oct. 18, 2006, now Pat. No. 7,489,003.

(30) Foreign Application Priority Data

Jan. 26, 2006 (KR) .................. 10-2006-0008313

(51) Int. Cl.
*H01L 21/336* (2006.01)
(52) U.S. Cl. ........ 438/258; 438/242; 438/257; 438/593; 438/E21.375
(58) Field of Classification Search .................. 438/242, 438/257–258, 593–594; 257/296–306
See application file for complete search history.

(56) References Cited

U.S. PATENT DOCUMENTS

| 6,492,233 | B2 | 12/2002 | Forbes et al. |
| 6,498,065 | B1 * | 12/2002 | Forbes et al. ............ 438/259 |
| 2001/0010957 | A1 | 8/2001 | Forbes et al. |

OTHER PUBLICATIONS

German Office Action dated Nov. 16, 2009 issued in corresponding German Application No. 10 2007 005 558.9-33.

* cited by examiner

*Primary Examiner* — Dung A. Le
(74) *Attorney, Agent, or Firm* — Mills & Onello, LLP

(57) ABSTRACT

In a semiconductor device and a method of manufacturing the semiconductor device, the semiconductor device includes a conductive structure, first insulating layers and first conductive layer patterns. The conductive structure includes a first portion, second portions and third portions. The second portions extend in a first direction on the first portion. The second portions are spaced apart from one another in a second direction substantially perpendicular to the first direction. The third portions are provided on the second portions. The third portions are spaced apart from one another in the first and second directions. The first insulating layers cover sidewalls of the second portions. The first conductive layer patterns are provided on the first insulating layers.

6 Claims, 26 Drawing Sheets

METHOD OF MANUFACTURING A SEMICONDUCTOR DEVICE HAVING A CHANNEL EXTENDING VERTICALLY

CROSS-REFERENCE TO RELATED APPLICATION

This application is a divisional application of U.S. patent application Ser. No. 11/582,750, filed on Oct. 18, 2006, which claims the benefit of Korean patent application number 10-2006-0008313, filed on Jan. 26, 2006, in the Korean Intellectual Property Office, the contents of which applications are incorporated herein in their entirety by reference.

BACKGROUND OF THE INVENTION

1. Field of the Invention

The present invention relates to a semiconductor device and a method of manufacturing the semiconductor device. More particularly, the present invention relates to a semiconductor device in which a channel extending vertically is generated, and a method of manufacturing the semiconductor device.

2. Description of the Related Art

A transistor includes a source region, a drain region, a body, an electrode and an insulating layer. The insulating layer electrically insulates the electrode from the source region, the drain region and the body. The electrode applies a voltage to the body.

An example of a conventional transistor having a body extending vertically is disclosed in U.S. Pat. No. 6,337,497. A source region and a drain region of the conventional transistor isolate the body. Thus, operation characteristics of the conventional transistor may be degraded due to a floating body effect. Specifically, holes are accumulated in the body because the body is isolated by the source region and the drain region while the transistor operates. When the holes are accumulated in the body, the operation characteristics of the conventional transistor may be degraded.

Conventional transistors capable of overcoming the above descried problem and methods of manufacturing the same are disclosed in U.S. Pat. No. 5,907,170, U.S. Pat. No. 6,395,597 and U.S. Pat. No. 6,191,448.

In accordance with U.S. Pat. No. 5,907,170, U.S. Pat. No. 6,395,597 and U.S. Pat. No. 6,191,448, a plurality of bodies is electrically connected to one another by using a body line. In addition, the body has a first sidewall and a second sidewall. The first sidewall of the body makes electric contact with the body line. On the other hand, the second sidewall of the body line makes electric contact with a word line.

That is, the body of the conventional transistor disclosed in U.S. Pat. No. 5,907,170, U.S. Pat. No. 6,395,597 and U.S. Pat. No. 6,191,448 makes electric contact with only one word line. Thus, a current operation capability of the conventional transistor may be relatively poor and thus slow down operation speed of the conventional transistor.

In addition, processes for forming the body line and the word line on the first sidewall and the second sidewall, respectively, are relatively complicated.

SUMMARY OF THE INVENTION

The present invention provides a semiconductor device including a body that is not isolated by source/drain regions such that a relatively wide channel capable of achieving a relatively high operation speed is generated.

The present invention also provides a method of manufacturing the semiconductor device.

In accordance with one aspect of the present invention, there is provided a semiconductor device including a conductive structure, first insulating layers and first conductive layer patterns. The conductive structure has a first portion, second portions and third portions. The second portions are located on the first portion and extend in a first direction. The second portions are spaced apart from one another in a second direction substantially perpendicular to the first direction. The third portions are located on the second portions and are spaced apart from one another in the first and second directions. The first insulating layers cover sidewalls of the second portions. The first conductive layer patterns are formed on the first insulating layers.

In one embodiment, the first portion and the third portions include n-type impurities, and the second portions include p-type impurities.

In one embodiment, the device further comprises second conductive layer patterns electrically connected to the third portions; a second insulating layer covering the second conductive layer patterns; and third conductive layer patterns formed on the second insulating layer, the third conductive layer patterns extending in the second direction, the third conductive layer patterns being spaced apart from one another in the first direction.

In one embodiment, the device further comprises a conductive member electrically connected to the second portions.

In accordance with another aspect of the present invention, there is provided a method of manufacturing a semiconductor device. In the method, a semiconductor substrate including a base and protrusions is formed. The protrusions are located on the base and extend in a first direction on the base. The protrusions are spaced apart from one another in a second direction substantially perpendicular to the first direction. First insulating layers are formed on sidewalls of the protrusions. First conductive layer patterns are formed on the first insulating layers. A first impurity region is formed at an upper portion of the base. Upper portions of the protrusions are partially removed to form convex portions on lower portions of the protrusions. The convex portions are spaced apart from one another in the first and second directions. Second impurity regions are formed at upper portions of the convex portions.

In one embodiment, the first and second impurity regions include substantially the same impurities. The impurities can be n-type impurities.

In one embodiment, the semiconductor substrate is doped with p-type impurities.

In one embodiment, the method further comprises: forming third conductive layer patterns electrically connected to the second impurity regions; forming a second insulating layer covering the third conductive layer patterns; and forming third conductive layer patterns on the second insulating layer, the third conductive layer patterns extending in the second direction, the third conductive layer patterns being spaced apart from one another in the first direction.

In one embodiment, the method further comprises forming a conductive member electrically connected to the lower portions of the protrusions.

According to the present invention, a semiconductor device includes a body that is not isolated by source/drain regions. In addition, a width of a channel generated in the semiconductor device is large so that an operation speed of the semiconductor device may be relatively fast. Because the source/drain regions may not isolate the body, an accumulation of holes in the body may be efficiently prevented. As a result, an operation failure of a semiconductor device due to the accumulation of the holes in the body may be reduced.

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DESCRIPTION OF THE PREFERRED EMBODIMENTS

Figure 1:
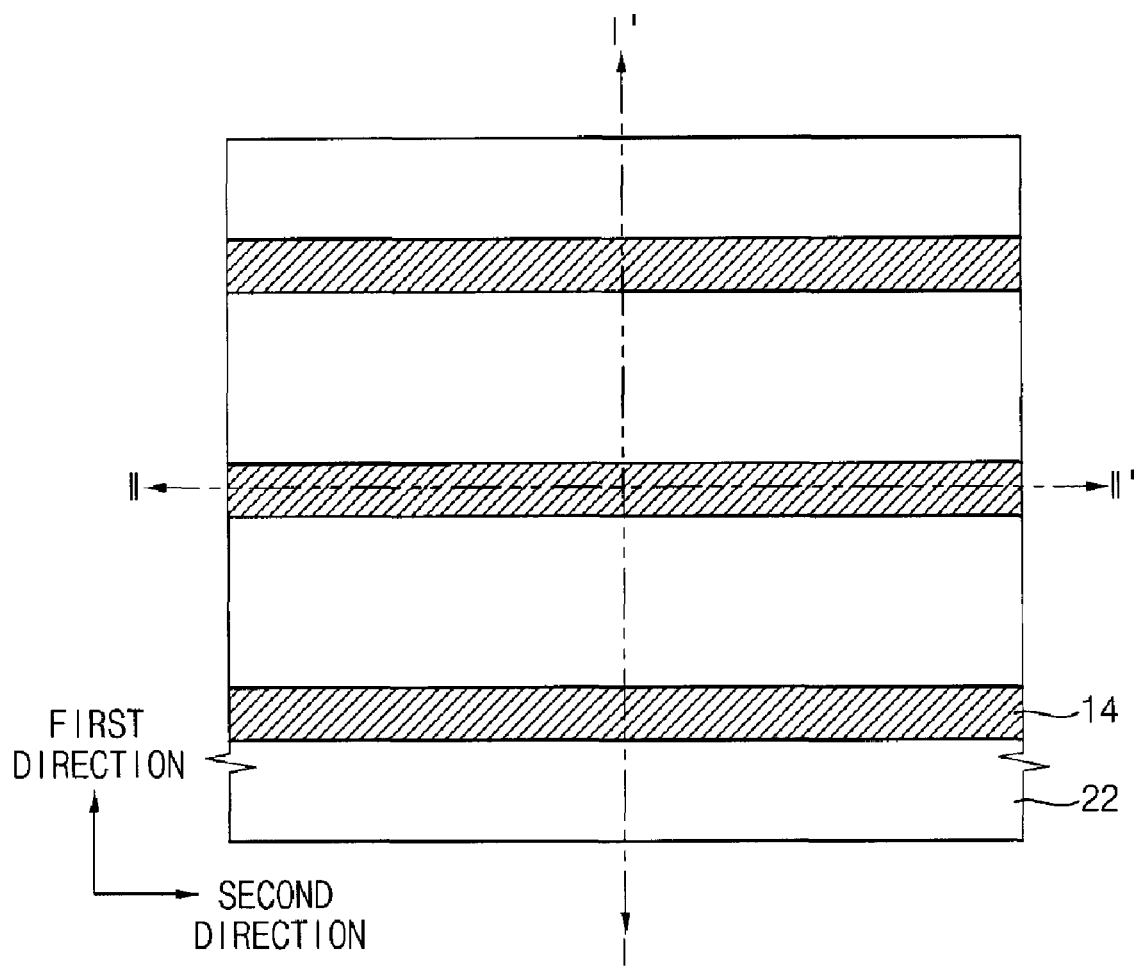
FIG. 1 is a plan view illustrating a semiconductor device in accordance with an embodiment of the present invention.

Embodiments of the present invention will be described with reference to the accompanying drawings. It will be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Figure 2:
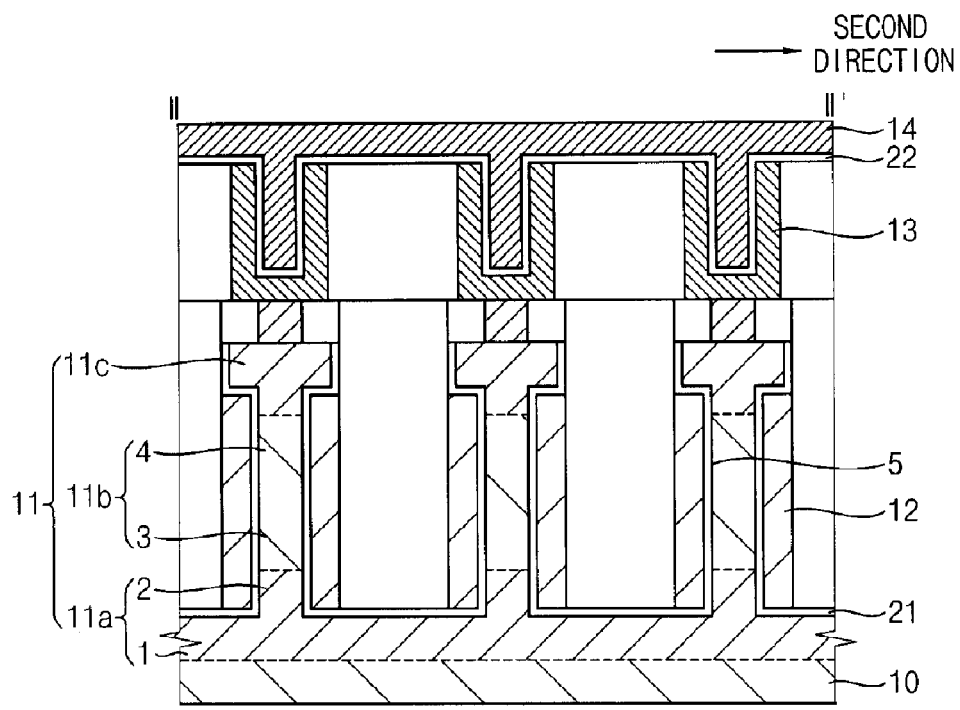
FIG. 2 is a cross-sectional view taken along line II-II' in FIG. 1.
Figure 3:
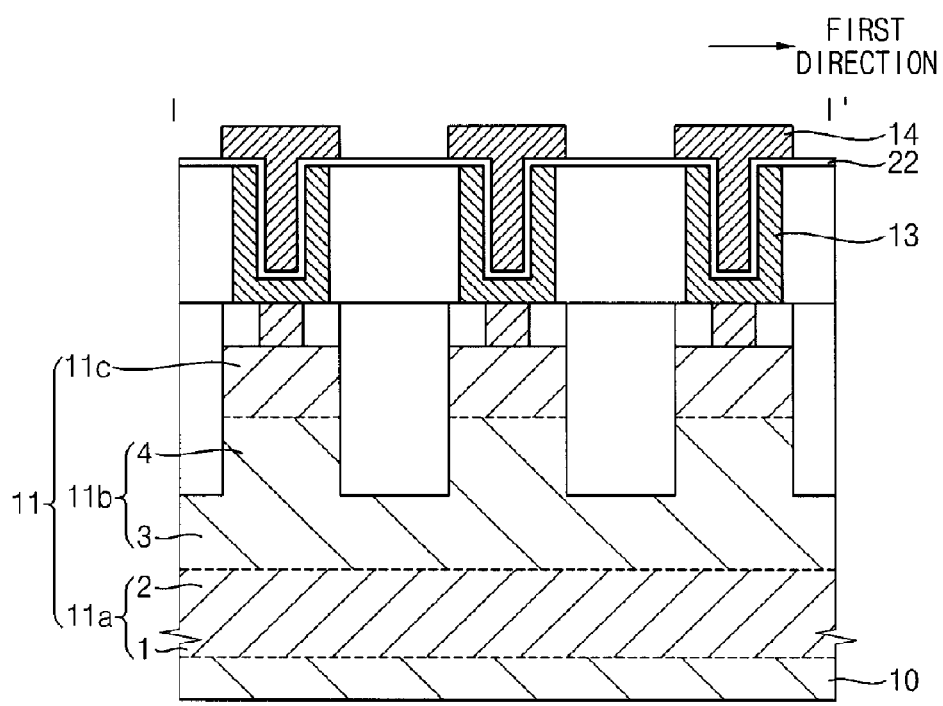
FIG. 3 is a cross-sectional view taken along line I-I' in FIG. 1.
Figure 4:
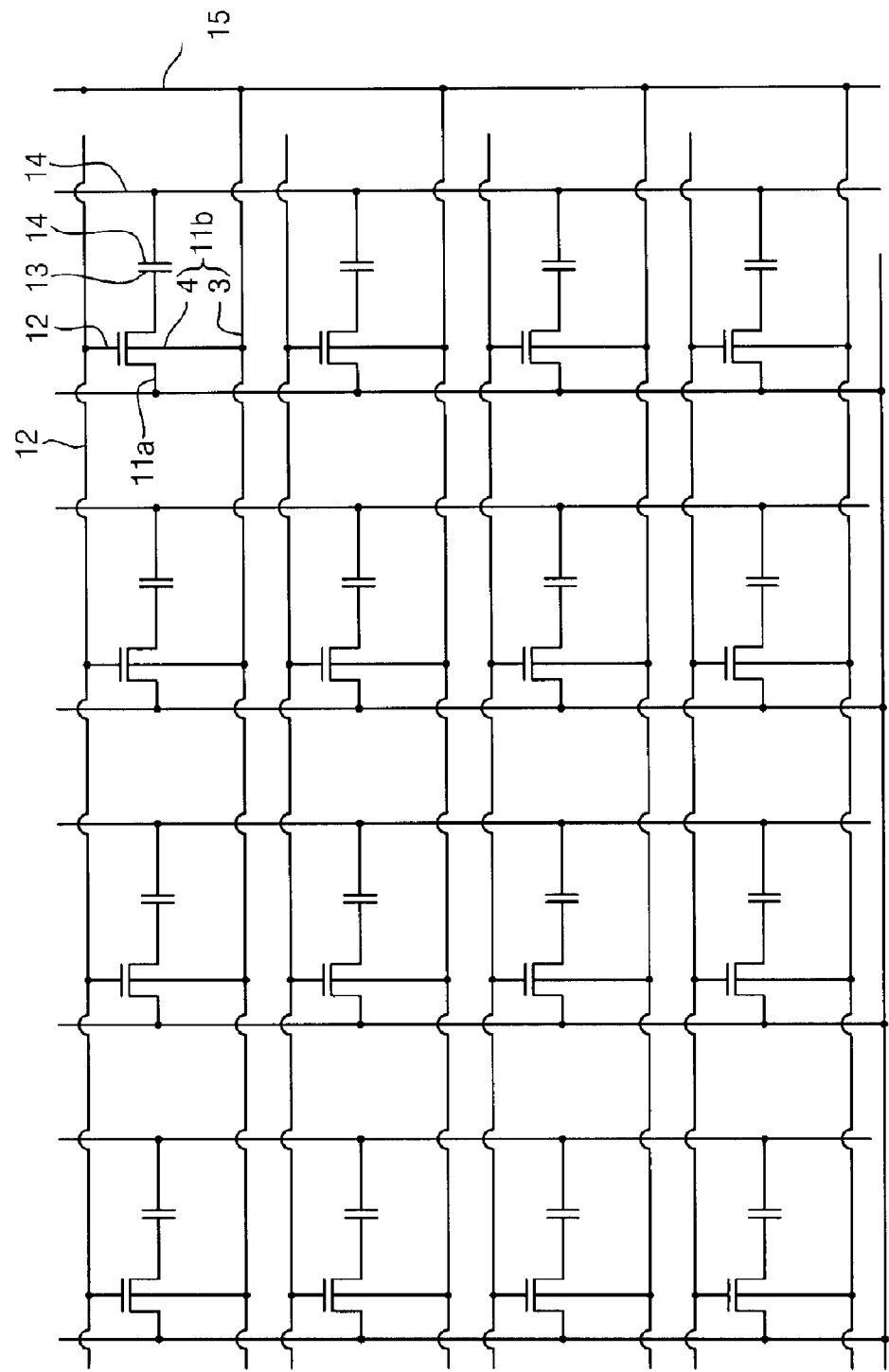
FIG. 4 is a circuit diagram of the semiconductor device in FIG. 1.

FIG. 1 is a plan view illustrating a semiconductor device in accordance with an embodiment of the present invention. FIG. 2 is a cross-sectional view taken along line II-II' in FIG. 1. FIG. 3 is a cross-sectional view taken along line I-I' in FIG. 1. FIG. 4 is a circuit diagram of the semiconductor device in FIG. 1.

Referring to FIGS. 1 to 4, the semiconductor device includes a conductive structure 11, first insulating layers 21 and first conductive layer patterns 12. The conductive structure 11 includes a first portion 11a, second portions 11b and third portions 11c.

A lower region 1 of the first portion 11a has a substantially plate-like shape. Upper regions 2 of the first portion 11a are provided on the lower region 1. The upper regions 2 extend in a first direction. In addition, the upper regions 2 of the first portion 11a are spaced apart from one another in a second direction substantially perpendicular to the first direction. The first portion 11a may be provided on a conductive region 10.

The second portions 11b are provided on the first portion 11a. Particularly, the second portion 11b is provided on the upper region 2 of the first portion 11a. The second portions 11b extend in the first direction. In addition, the second portions 11b are spaced apart from one another in the second direction. Particularly, lower regions 3 of the second portions 11b have substantially bar-like shapes. In addition, the lower regions 3 of the second portions 11b extend in the first direction. Upper regions 4 of the second portions 11b are spaced apart from one another in the first and second direction on the lower portions 3 of the second portions 11b.

The third portions 11c are spaced apart from one another in the first and second directions on the second portions 11b. Particularly, the third portions 11c are provided on the upper regions 4 of the second portions 11b. A width of the third portion 11c measured in the second direction may be substantially larger than a width of the second portion 11b measured in the second direction.

The first portion 11a and the third portions 11c may include negative typed impurities (i.e., n-type impurities) providing electrons. The n-type impurity may be phosphorus (P), arsenic (As) or antimony (Sb). These may be used alone or in combination. The first portions 11a and the third portions 11c are used as source/drain regions. Particularly, the first portion 11a is used as a lower source/drain region. The third portion 11c is used as an upper source/drain region.

The second portions 11b may include positive typed impurities (i.e., p-type impurities) providing holes. The p-type impurity may be boron (B), aluminum (Al), gallium (Ga) or indium (In). These may be used alone or in combination. The second portions 11b correspond to bodies in which channels are generated.

In case that the first portion 11a and the third portions 11c include n-type impurities, the conductive region 10 located under the first portion 11a may include p-type impurities.

The first insulating layers 21 cover sidewalls of the second portion 11b. The first insulating layers 21 have substantially uniform thicknesses. The first insulating layers 21 extend in the first direction. The first insulating layers 21 are spaced apart from one another in the second direction. That is, the first insulating layers 21 are formed on inner faces of grooves 5 defined by the first portion 11a, the second portions 11b and the third portions 11c.

The first conductive layer patterns 12 extend in the first direction on the first insulating layers 21. The first conductive layer patterns 12 are spaced apart from one another in the second direction. The first conductive layer patterns 12 horizontally correspond to the second portions 11b. In addition, the first insulating layers 21 electrically insulate the first conductive layer patterns 12 from the conductive structure 11. The first conductive layer patterns 12 correspond to word lines.

Particularly, each of the second portions 11b horizontally corresponds to two of the first conductive layer patterns 12. Thus, the semiconductor device of the present embodiment may have an operation speed substantially higher than those described in U.S. Pat. No. 5,907,170, U.S. Pat. No. 6,395,597 and U.S. Pat. No. 6,191,448.

In addition, in accordance with U.S. Pat. No. 5,907,170, U.S. Pat. No. 6,395,597 and U.S. Pat. No. 6,191,448, a plurality of bodies is electrically connected to one another using a body line. However, in accordance with the present embodiment, the second portion 11b corresponding to a body has the lower region 3 extending in the first direction. Because the lower region 3 of the second portion 11b serves AS the body line, any further required processes for forming the body line are not necessary.

The semiconductor device may further include second conductive layer patterns 13, a second insulating layer 22 and third conductive layer patterns 14. The second conductive layer patterns 13 are electrically connected to the third portions 11c. The second conductive layer patterns 13 may have substantially cylindrical shapes. The second insulating layer 22 is formed on the second conductive layer patterns 13. The third conductive layer patterns 14 extend in the second direction on the second insulting layer 22. The third conductive layer patterns 14 are spaced apart from one another in the first direction. The third conductive layer patterns 14 correspond to bit lines.

Here, the second conductive layer pattern 13 corresponds to a lower electrode of a capacitor. The second insulating layer 22 corresponds to a dielectric layer of the capacitor. The third conductive layer pattern 14 corresponds to an upper electrode of the capacitor.

In addition, the semiconductor device may further include a conductive member 15 (See FIG. 4) electrically connected to the lower portions 3 of the second portions 11b. That is, the conductive member 15 electrically connects the second portions 11b to one another.

FIGS. 5, 8, 11, 14, 17, 20, 23, 26, 29, 32, 35, 38, 41, 44 and 47 are plan views illustrating a method of manufacturing the semiconductor device in FIG. 1. FIGS. 6, 9, 12, 15, 18, 21, 24, 27, 30, 33, 36, 39, 42, 45 and 48 are cross-sectional views taken along lines I-I' in FIGS. 5, 8, 11, 14, 17, 20, 23, 26, 29, 32, 35, 38, 41, 44 and 47, respectively. FIGS. 7, 10, 13, 16, 19, 22, 25, 28, 31, 34, 37, 40, 43, 46 and 49 are cross-sectional views taken along lines II-II' in FIGS. 5, 8, 11, 14, 17, 20, 23, 26, 29, 32, 35, 38, 41, 44 and 47, respectively.

Figure 5:
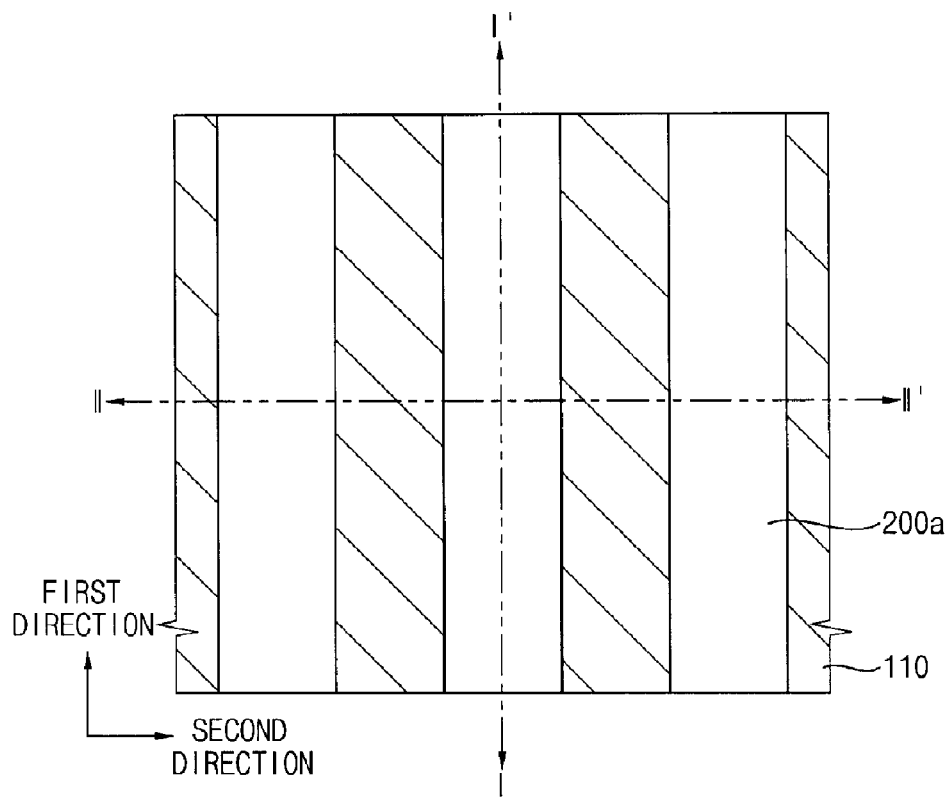
FIGS. 5, 8, 11, 14, 17, 20, 23, 26, 29, 32, 35, 38, 41, 44 and 47 are plan views illustrating steps in manufacturing the semiconductor device in FIG. 1, according to an embodiment of the invention.
Figure 6:
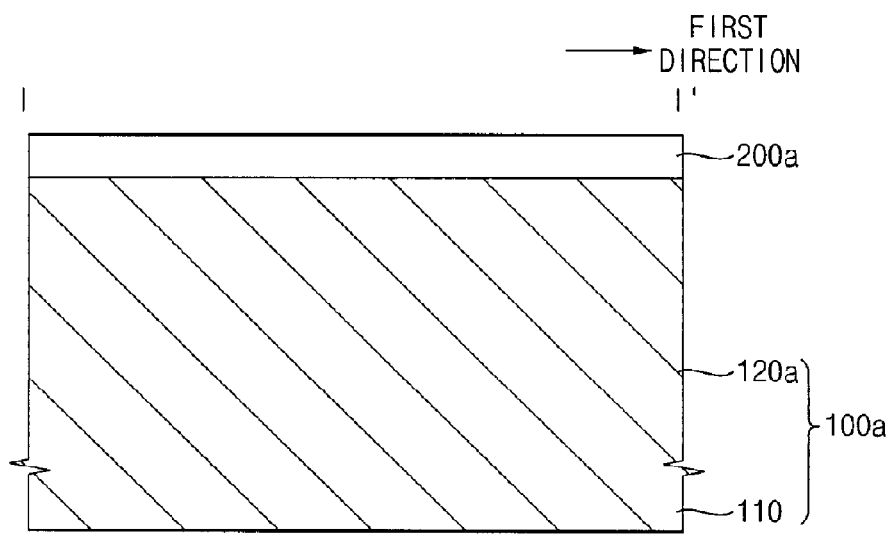
FIGS. 6, 9, 12, 15, 18, 21, 24, 27, 30, 33, 36, 39, 42, 45 and 48 are cross-sectional views taken along lines I-I' in FIGS. 5, 8, 11, 14, 17, 20, 23, 26, 29, 32, 35, 38, 41, 44 and 47, respectively.
Figure 7:
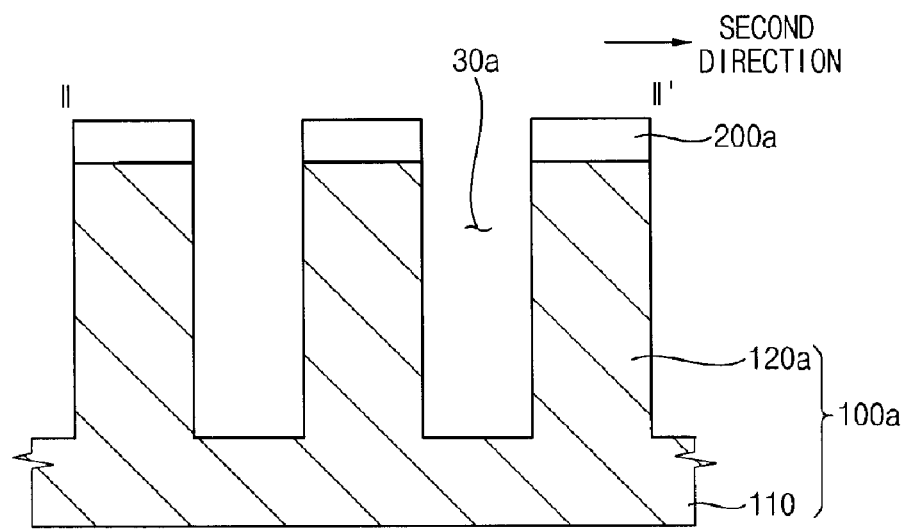
FIGS. 7, 10, 13, 16, 19, 22, 25, 28, 31, 34, 37, 40, 43, 46 and 49 are cross-sectional views taken along lines II-II' in FIGS. 5, 8, 11, 14, 17, 20, 23, 26, 29, 32, 35, 38, 41, 44 and 47, respectively.

Referring to FIGS. 5 to 7, a preliminary semiconductor substrate 100a including a base 110 and preliminary protrusions 120a is formed. The preliminary protrusions 120a extend in a first direction on the base 110. The preliminary protrusions 120a are spaced apart from one another in a second direction substantially perpendicular to the first direction.

The base 110 and the preliminary protrusions 120a together define preliminary grooves 30a. The preliminary grooves 30a extend in the first direction. The preliminary grooves 30a are spaced apart from one another in the second direction.

The preliminary semiconductor substrate 100a may be formed by an etching process. In the etching process, preliminary first mask layer patterns 200a are used together as a first etch mask. The preliminary first mask layer patterns 200a extend in the first direction. The preliminary first mask layer patterns 200a are spaced apart from one another in the second direction.

The preliminary semiconductor substrate 100a may include p-type impurities providing holes. The p-type impurity may be boron, aluminum, gallium or indium. These may be used alone or in combination.

Figure 8:
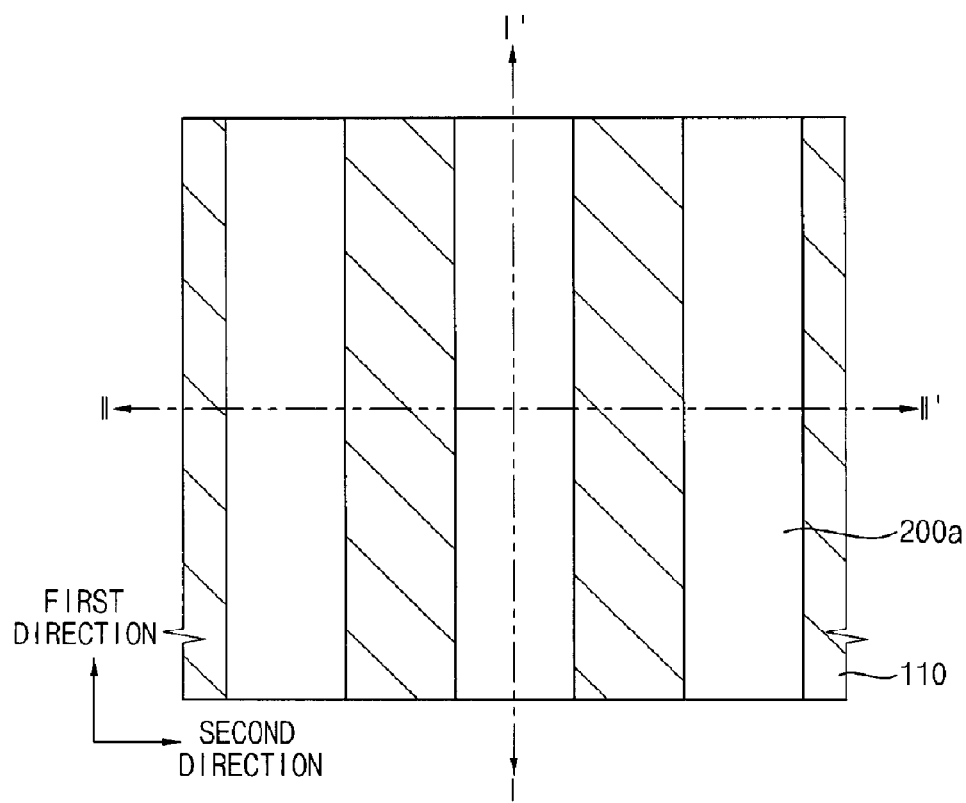
Figure 9:
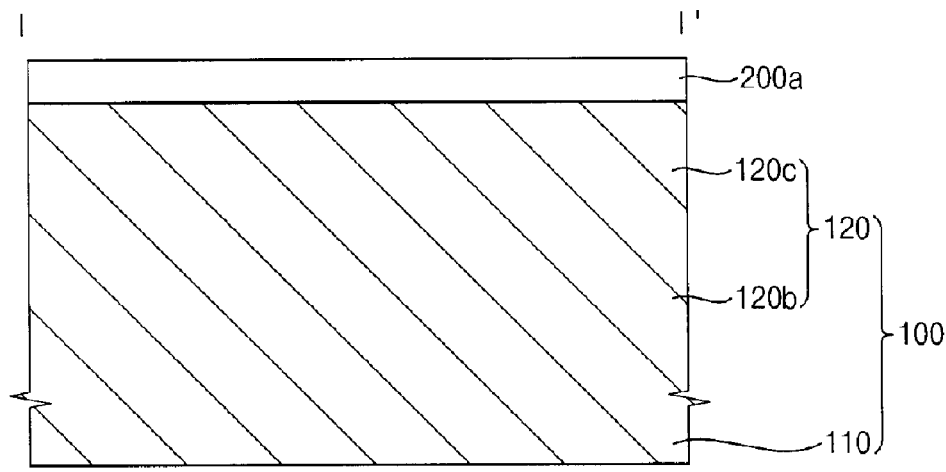
Figure 10:
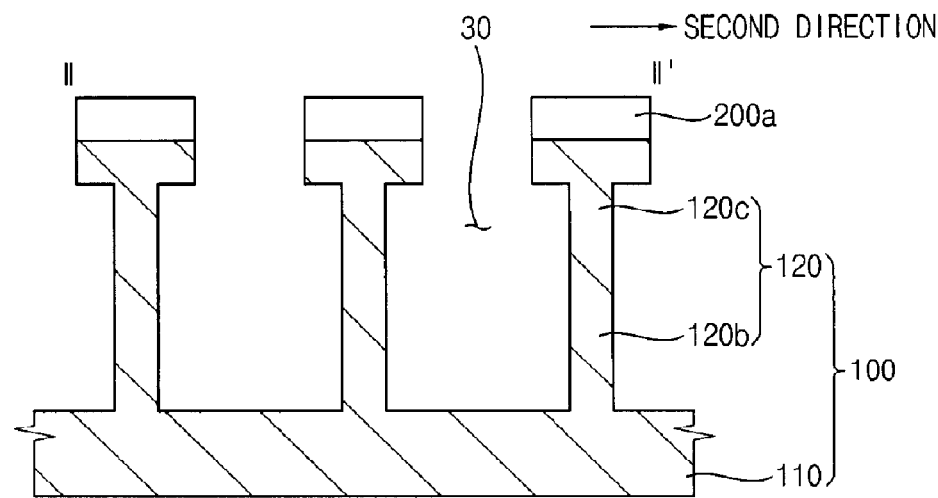

Referring to FIGS. 8 to 10, sidewalls of preliminary protrusions 120a are etched using the preliminary first mask layer patterns 200a together as a second etch mask to form protrusions 120 on the base 110. Here, the sidewalls of the preliminary protrusions 120a may be isotropically etched. The protrusions 120 extend in the first direction. The protrusions 120 are spaced apart from one another in the second direction. In addition, the protrusions 120 include lower portions 120b and upper portions 120c.

Here, the lower portion 120b of the protrusion 120 serves as a body line disclosed in U.S. Pat. No. 5,907,170, U.S. Pat. No. 6,395,597 and U.S. Pat. No. 6,191,448. Thus, complex processes employed in U.S. Pat. No. 5,907,170, U.S. Pat. No. 6,395,597 and U.S. Pat. No. 6,191,448 to form the body line are not required.

The base 110 and protrusions 120 together define grooves 30. The grooves 30 extend in the first direction. The grooves 30 are spaced apart from one another in the second direction. Sizes of the grooves 30 are substantially larger than sizes of the preliminary grooves 30a.

Figure 11:
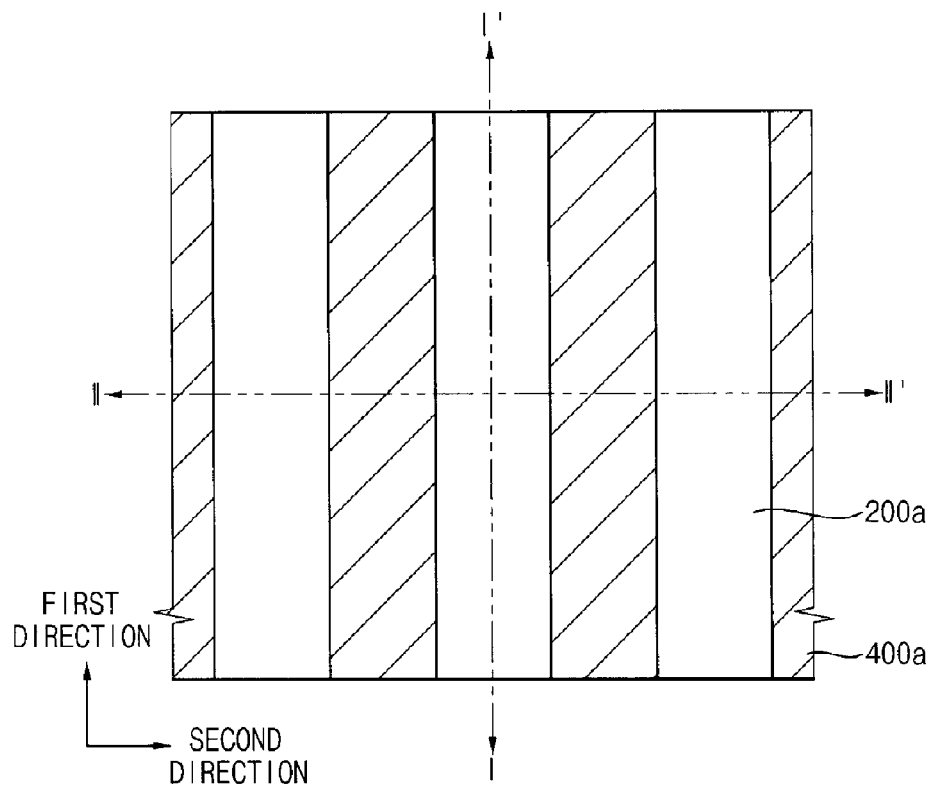
Figure 12:
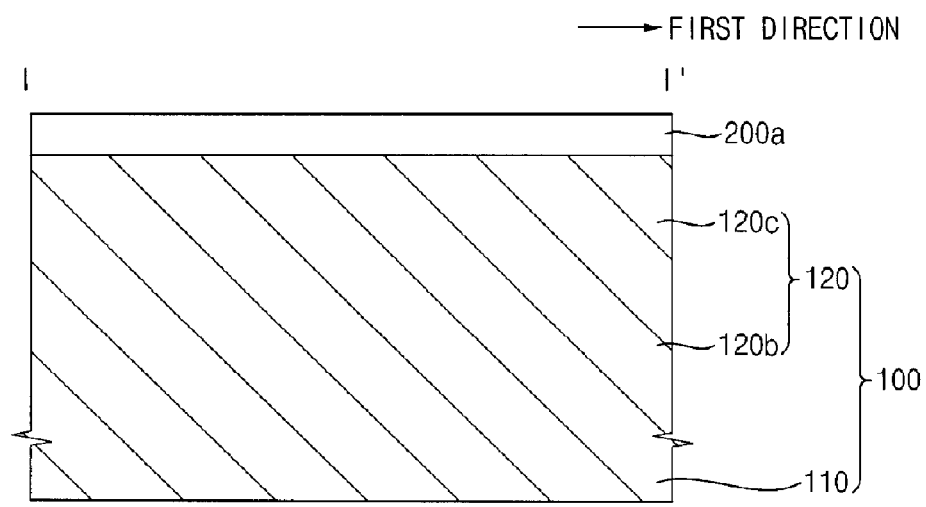
Figure 13:
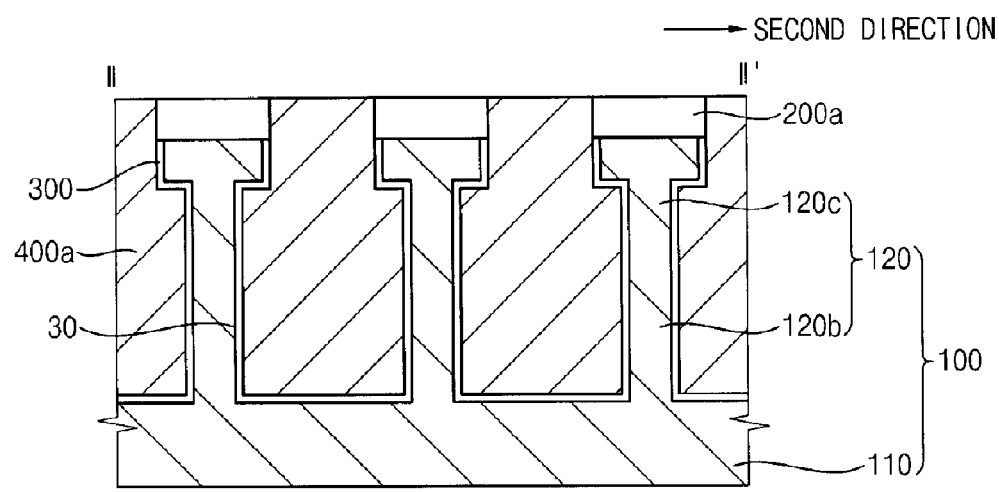

Referring to FIGS. 11 to 13, first insulating layers 300 having substantially uniform thicknesses are formed on inner faces of the grooves 30. The first insulating layers 300 substantially conform to the inner faces of the grooves 30. In case that the first insulating layers 300 include oxide, the first insulating layers 300 may be formed by a thermal oxidation process.

Thereafter, a first conductive layer is formed on the first insulating layers 300 to fill up the grooves 30 partially filled with the first insulating layers 300. The first conductive layer may include polysilicon doped with impurities. Thereafter, the first conductive layer is planarized until the preliminary first mask layer patterns 200a are exposed so that preliminary first conductive layer patterns 400a may be formed. The preliminary first conductive layer patterns 400a extend in the first direction. In addition, the preliminary first conductive layer patterns 400a are spaced apart from one another in the second direction.

Figure 14:
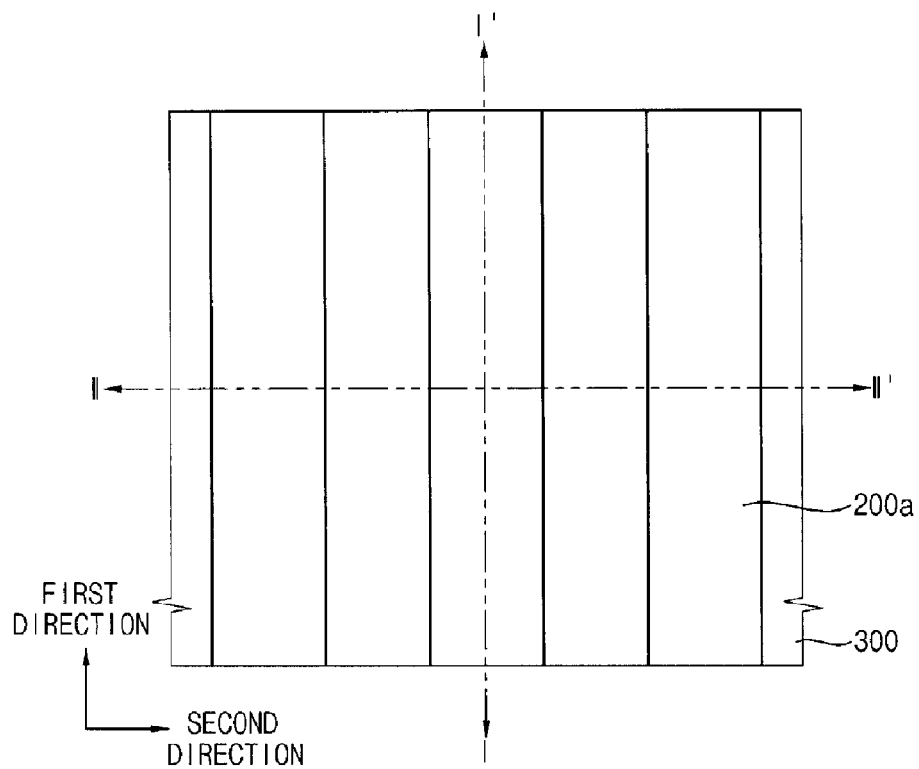
Figure 15:
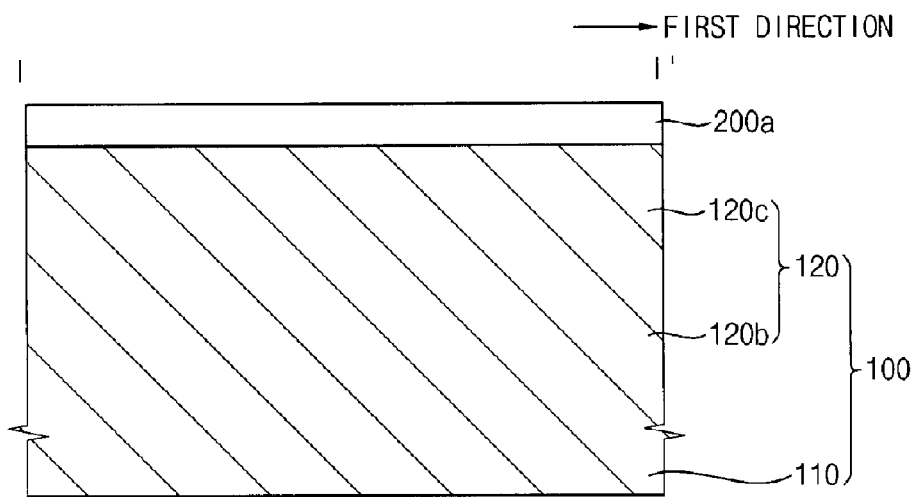
Figure 16:
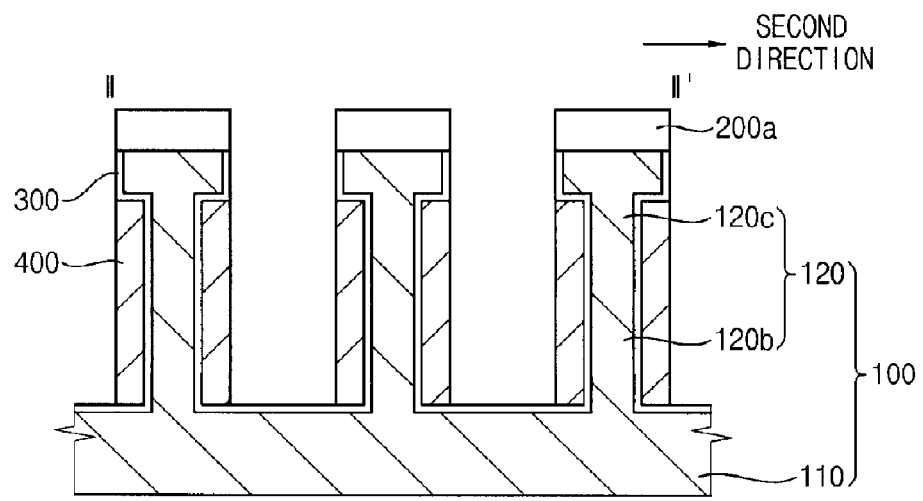

Referring to FIGS. 14 to 16, the preliminary first conductive layer pattern 400a is etched using the preliminary mask layer patterns 200a together as a third etch mask. Thus, first conductive layer patterns 400 are formed under the third etch mask. That is, the first conductive layer patterns 400 are formed on sidewalls of the protrusions 120 covered with the first insulating layers 300. Here, the preliminary first conductive layer patterns 400a may be anisotropically etched. The first conductive layer patterns 400 extend in the first direction. The first conductive layer patterns 400 are spaced apart from one another in the second direction. The first conductive layer patterns 400 correspond to word lines.

In one embodiment, portions of the first insulating layers 300, the portions being exposed between the first conductive layer patterns 400, are selectively etched after the first conductive layer patterns 400 are formed. In this case, the base 110 is partially exposed.

Figure 17:
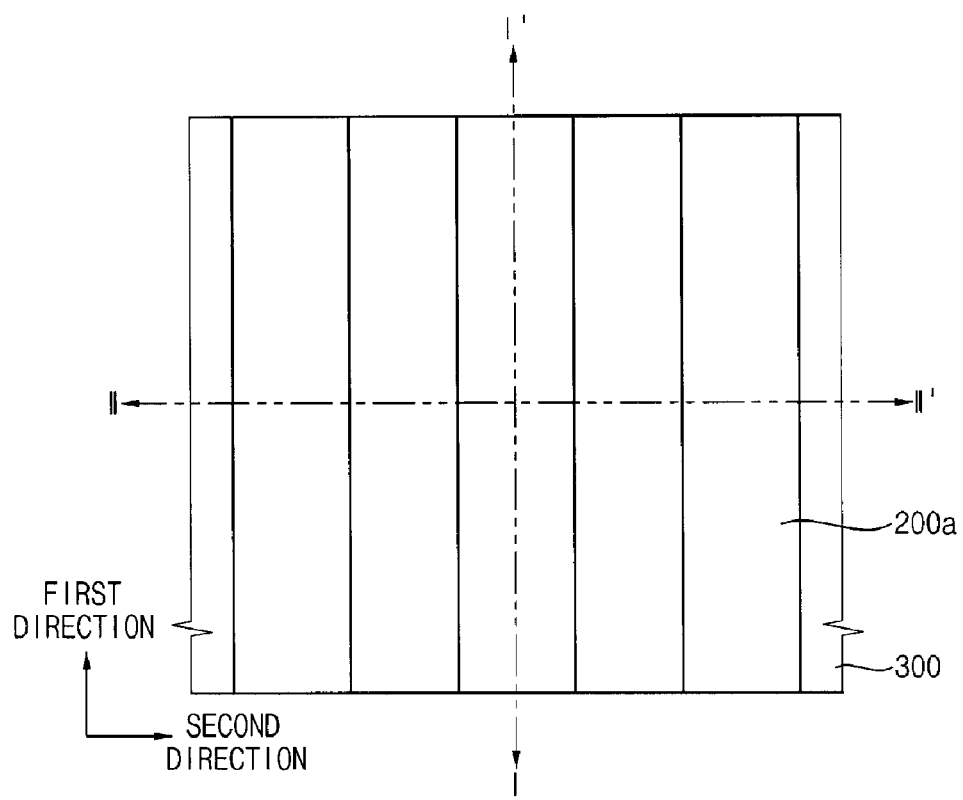
Figure 18:
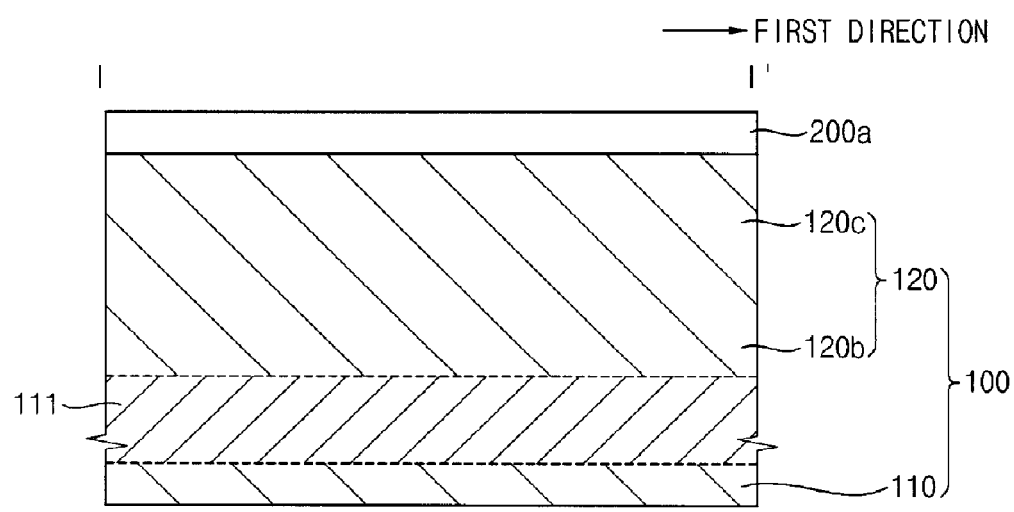
Figure 19:
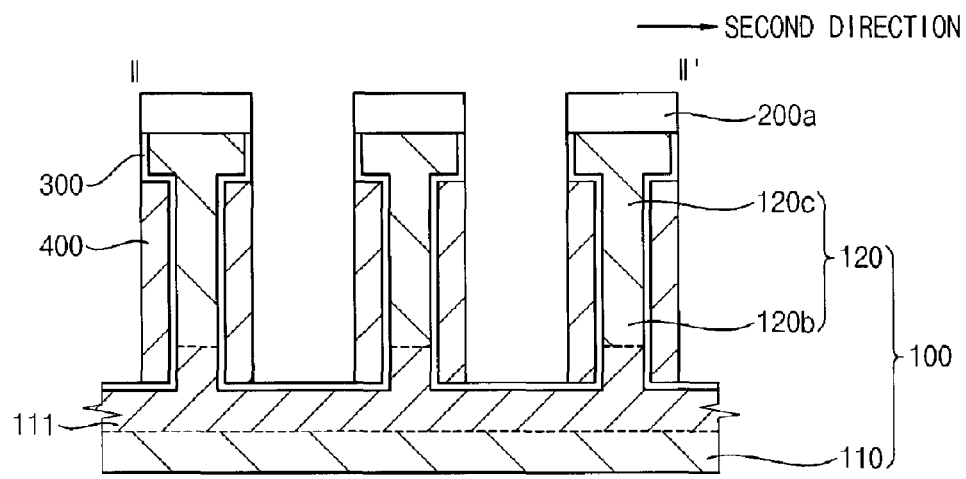

Referring to FIGS. 17 to 19, a first impurity region 111 is formed at an upper portion of the base 110. The first impurity region 111 includes negative typed impurities (i.e., n-type impurities) providing electrons. The n-type impurity may be phosphorus, arsenic or antimony. These may be used alone or in combination.

Particularly, the n-type impurities are doped at the base 110 using the first preliminary mask layer patterns 200a and the first conductive layer patterns 400 together as a first ion implantation mask. Thus, the first impurity region 111 is formed at the upper portion of the base 110. The first impurity region 111 may have a substantial plate shape.

Here, the n-type impurities in the first impurity regions 111 may be diffused into bottom portions of the protrusions 120. In this case, the first impurity regions 111 extend from the upper portion of the base to the bottom portions of the protrusions 120.

In case that the portions of the first insulating layers 300 exposed between the first conductive layer patterns 400 are selectively removed, the n-type impurities may be directly implanted into the upper portion of the base 110. However, in this case, defects may be generated at the upper portion of the base 110. Thus, the upper portion of the base 110 may be thermally treated so that the defects may be cured.

Figure 20:
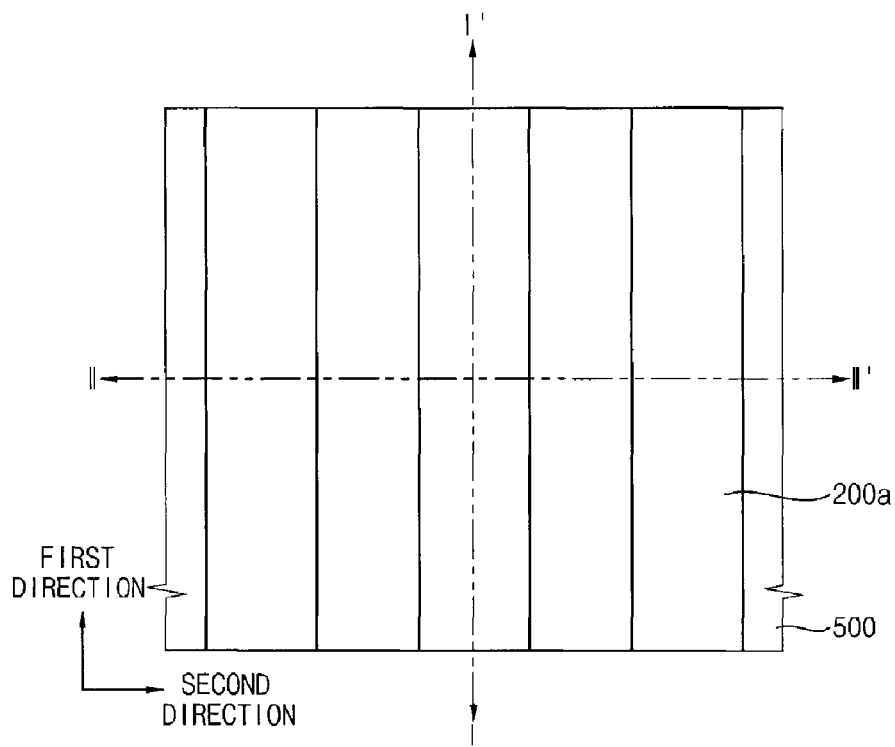
Figure 21:
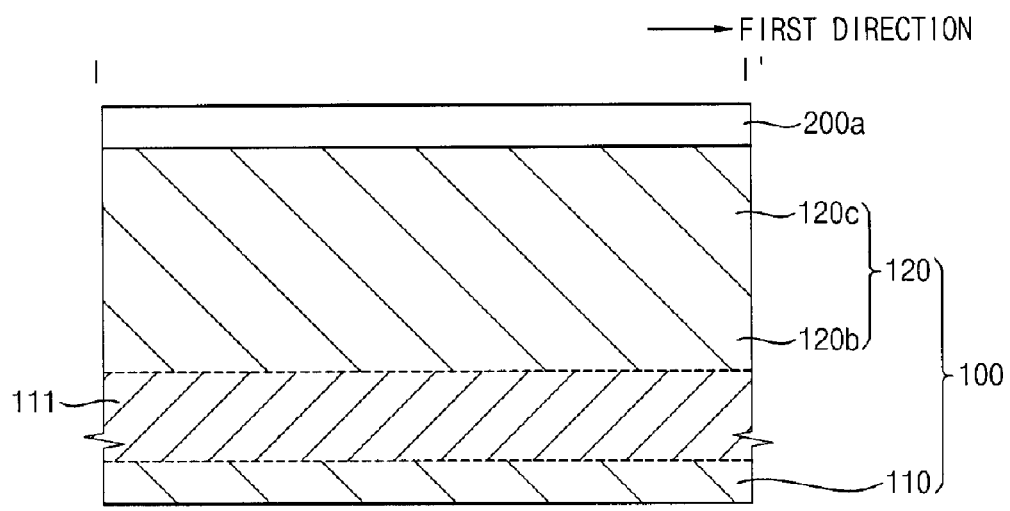
Figure 22:
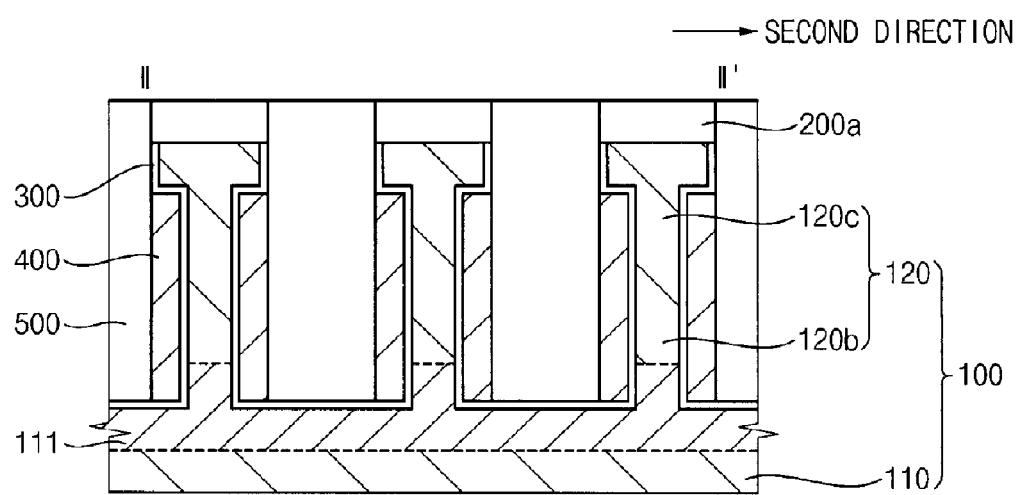

Referring to FIGS. 20 to 22, a first insulator is formed such that the first insulator fills up the grooves 30 partially filled with the insulating layers 300 and the first conductive layer patterns 400. Thereafter, the first insulator is planarized until the first preliminary mask layer patterns 200a are exposed so that first insulator patterns 500 are formed.

Figure 23:
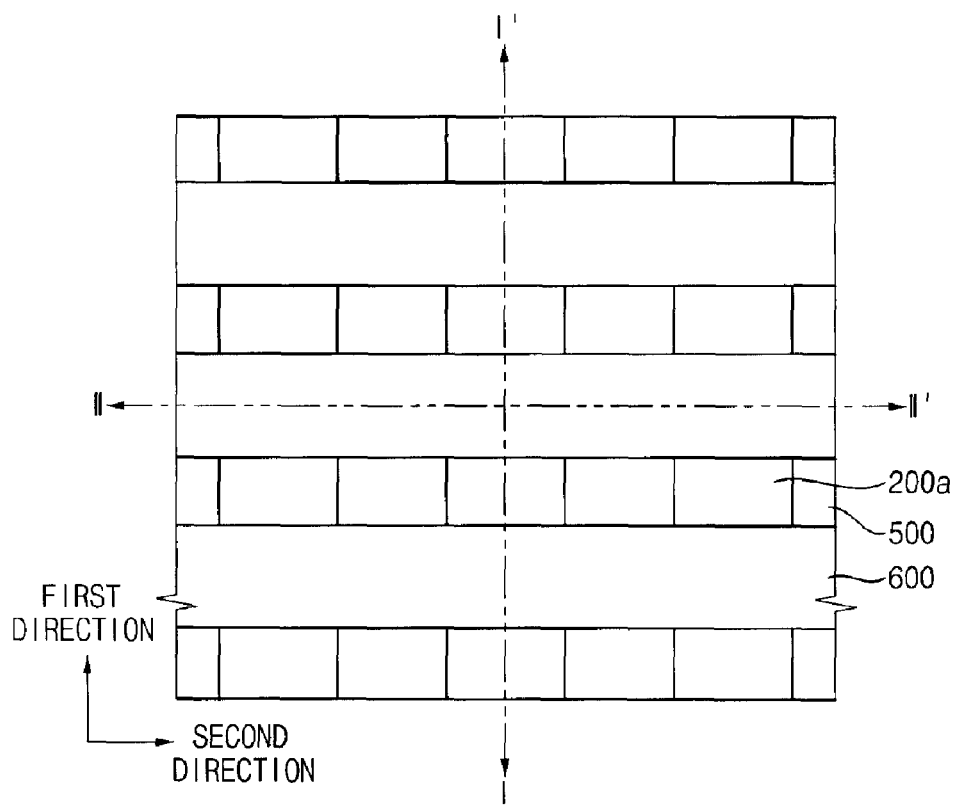
Figure 24:
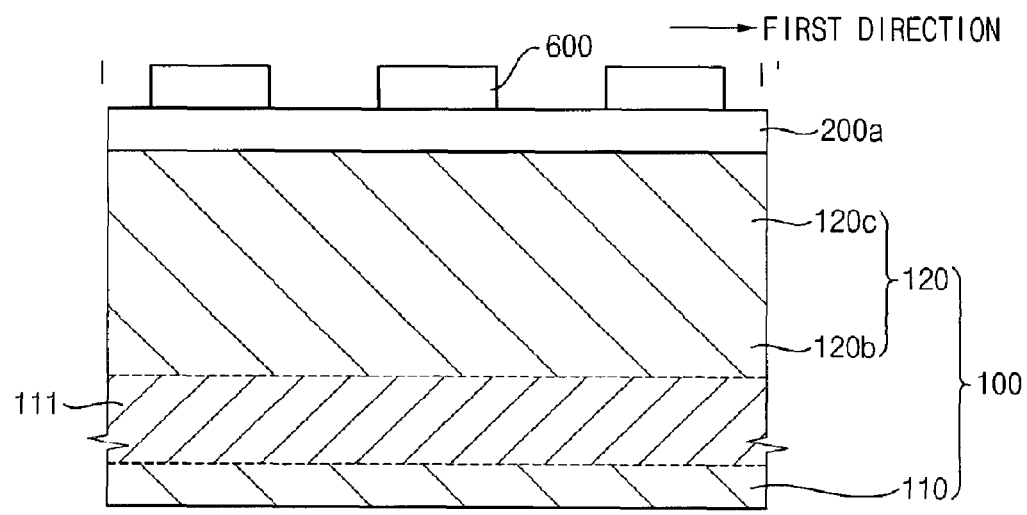
Figure 25:
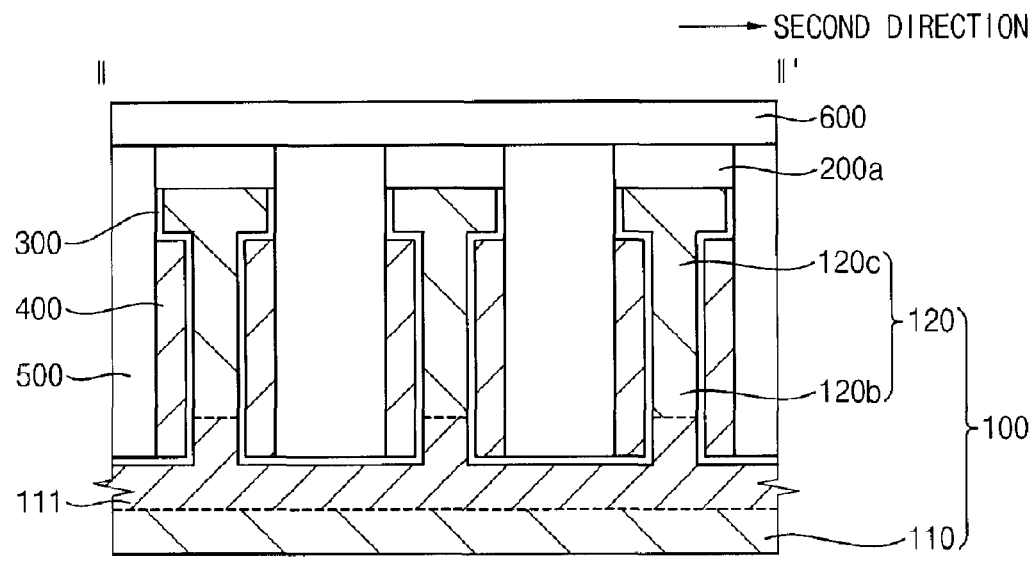

Referring to FIGS. 23 to 25, second mask layer patterns 600 are formed on the first insulator patterns 500 and the first preliminary mask layer patterns 200a. The second mask layer patterns 600 extend in the second direction. The second mask layer patterns 600 are spaced apart from one another in the first direction.

Figure 26:
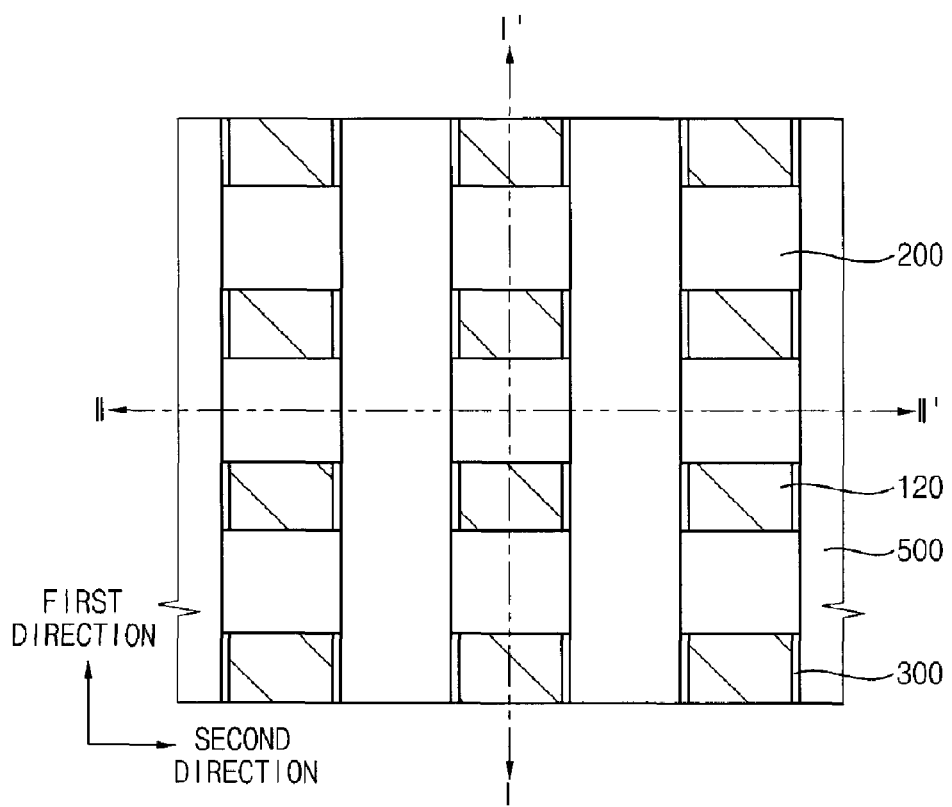
Figure 27:
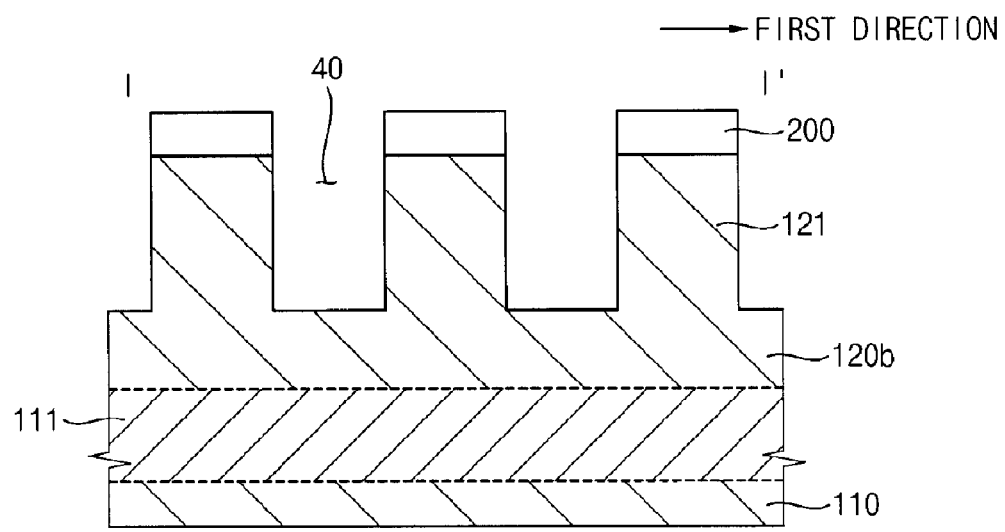
Figure 28:
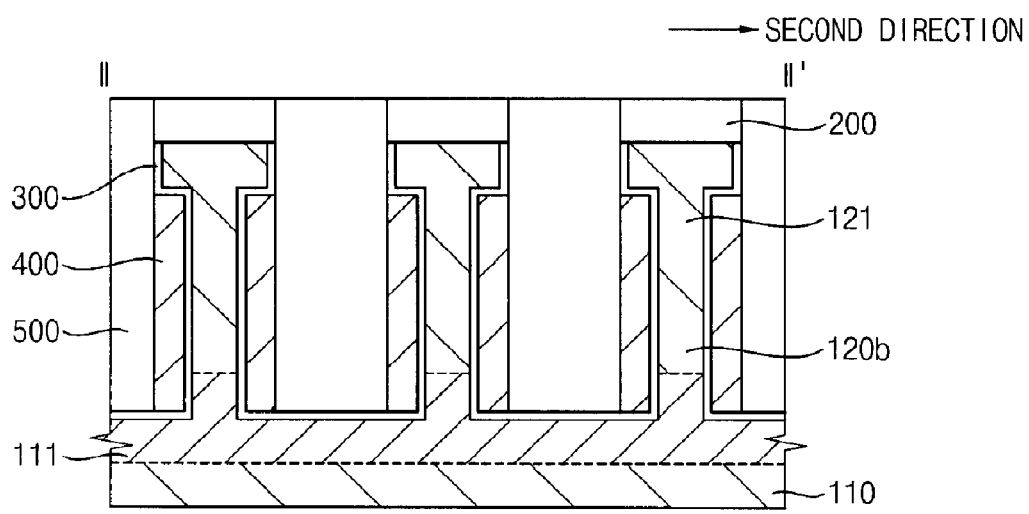

Referring to FIGS. 26 to 28, the preliminary first mask layer patterns 200a are partially etched using the second mask layer patterns 600 and the first insulator patterns 500 together as a fourth etch mask. Thus, first mask layer patterns 200 are formed. The first mask layer patterns 200 are spaced apart from the first and second directions.

Thereafter, upper portions 120c of the protrusions 120 are partially etched using the first mask layer patterns 200, the second mask layer patterns 600 and the first insulator patterns 500 together as a fifth etch mask. Here, the first impurity region 111 may not be exposed. Thus, convex portions 121 are formed on the lower portions 120b of the protrusions 120. The convex portions 121 are spaced apart from one another in the first and second directions. The lower portions 120b of the protrusions 120, the convex portions 121 and the first insulating layers 300 together define recesses 40. Particularly, the recesses 40 are defined in the first direction by the convex portions 121. The recesses 40 are defined in the second direction by the first insulating layers 300. Thereafter, the second mask patterns 600 are removed.

Figure 29:
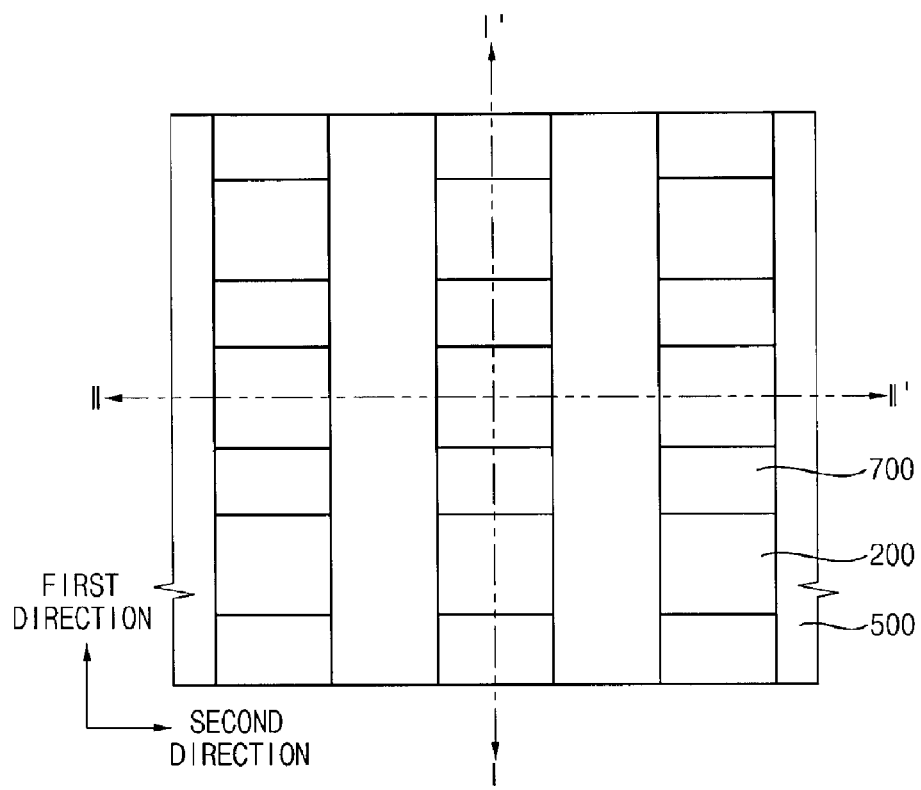
Figure 30:
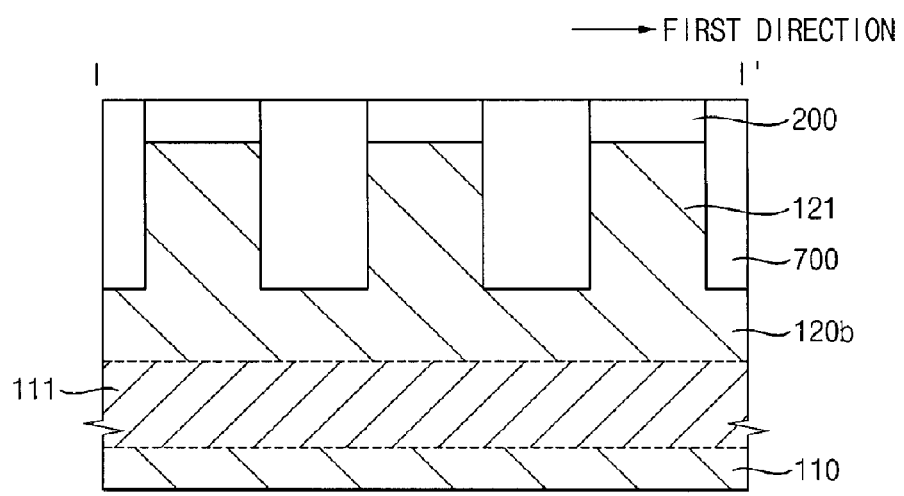
Figure 31:
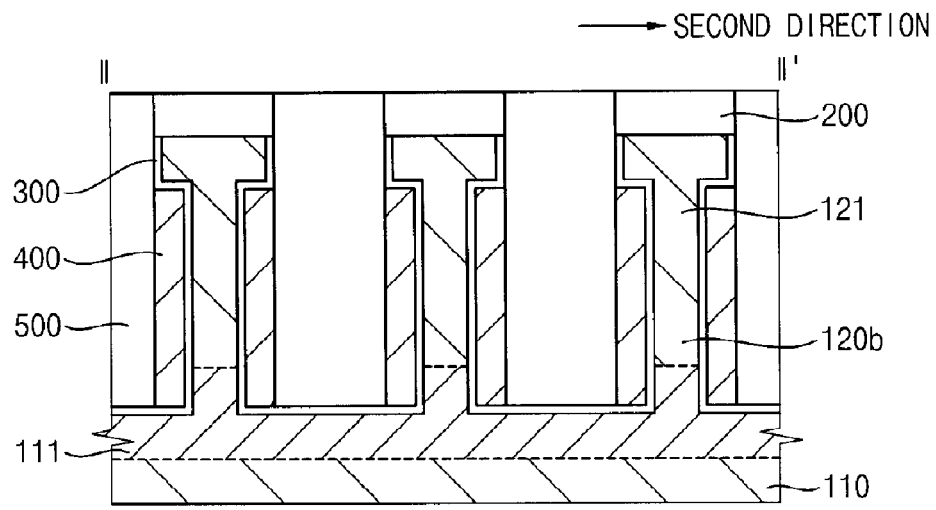

Referring to FIGS. 29 to 31, a second insulator is formed on the first mask layer patterns 200 and the first insulating layers 300 to fill the recesses 40. Thereafter, the second insulator is planarized until the first mask layer patterns 200 and the first insulator patterns 500 are exposed so that second insulator patterns 700 may be formed.

Figure 32:
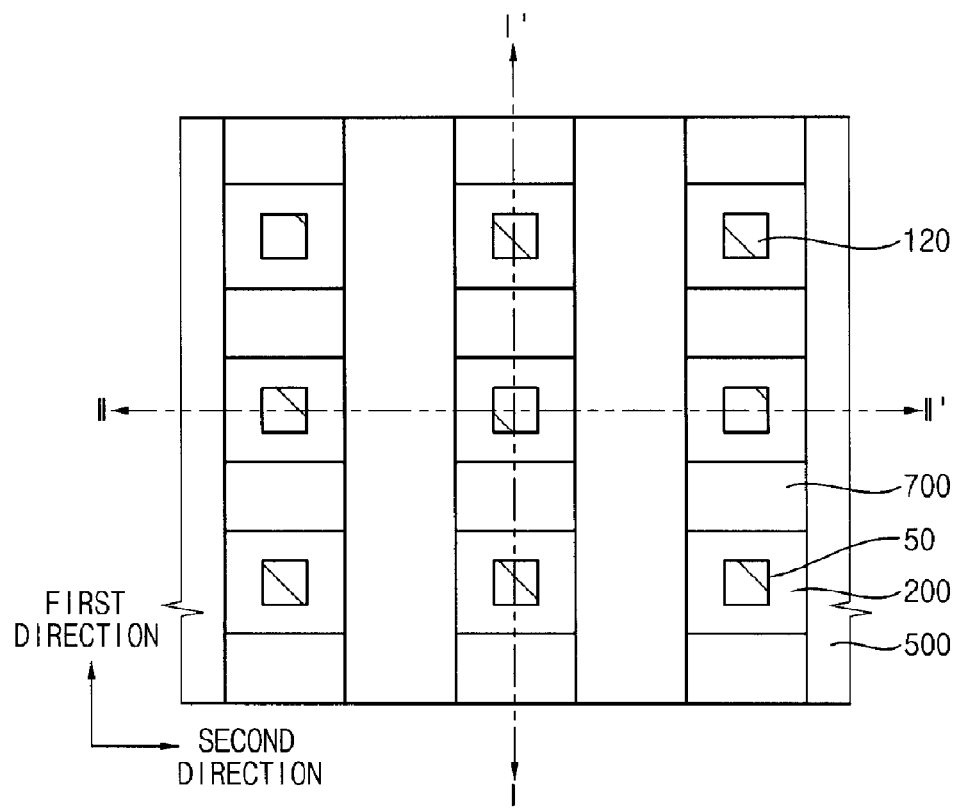
Figure 33:
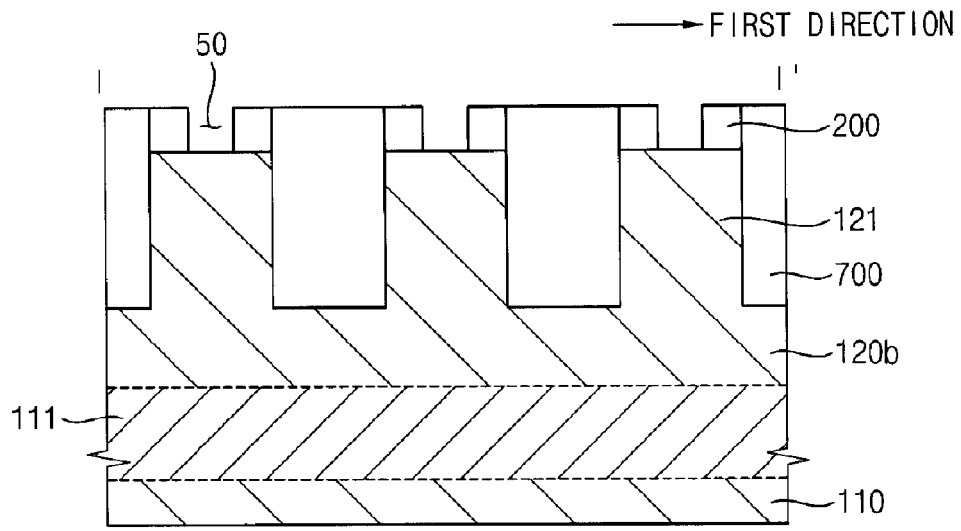
Figure 34:
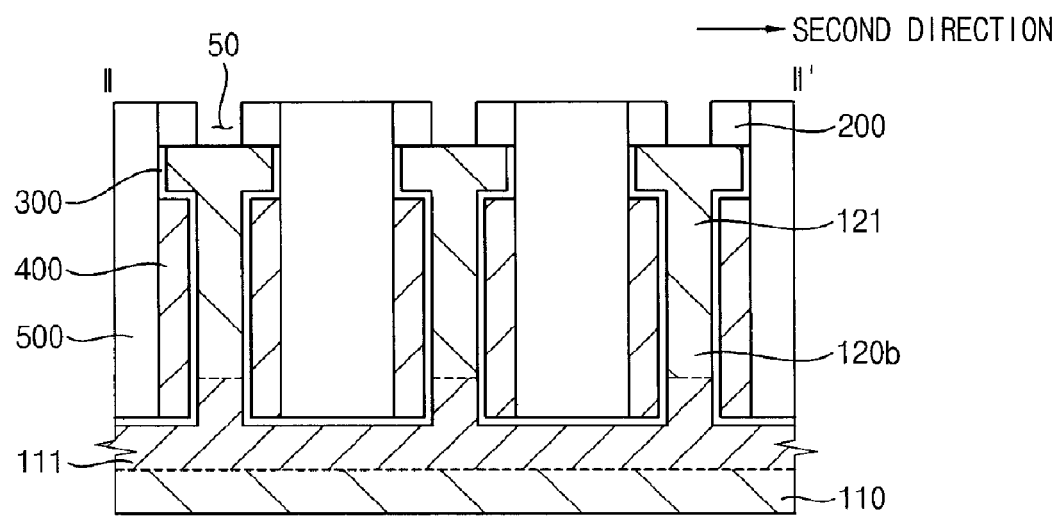

Referring to FIGS. 32 to 34, first openings 50 are formed through the first mask layer patterns 200. Thus, the protrusions 120 are partially exposed through the openings 120.

Figure 35:
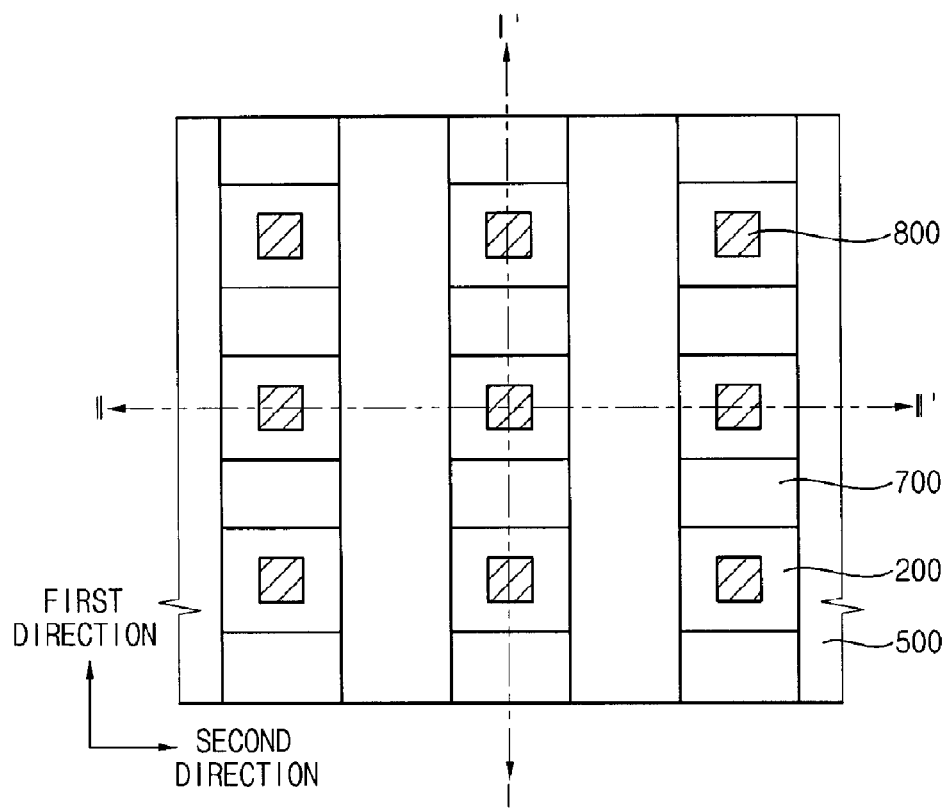
Figure 36:
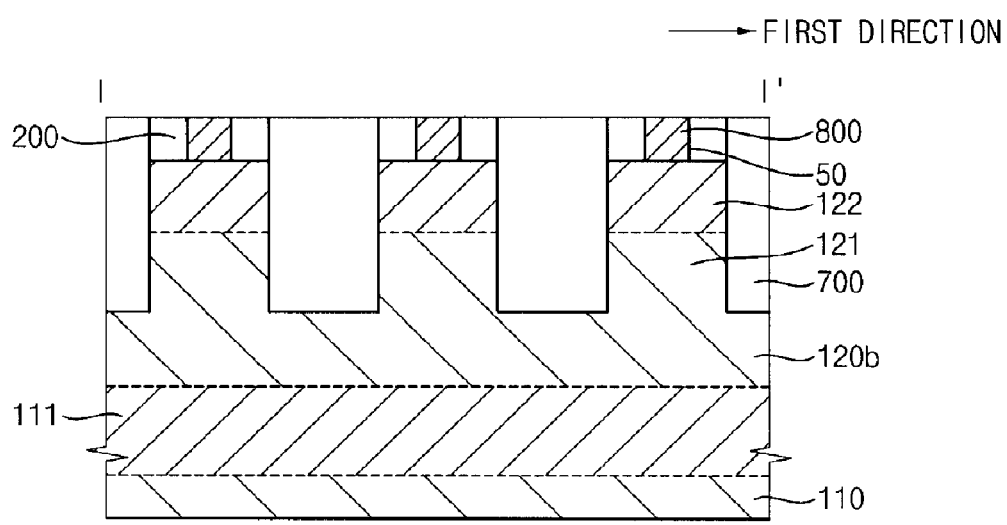
Figure 37:
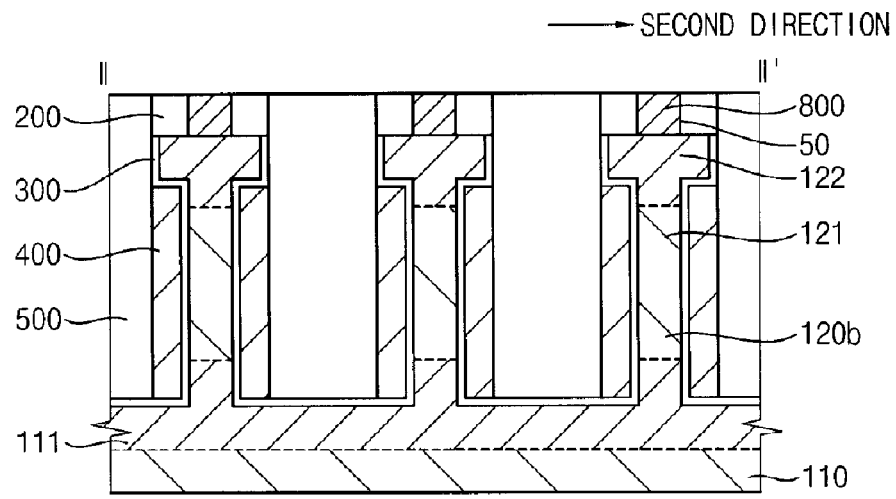

Referring to FIGS. 35 to 37, second impurity regions 122 are formed at upper portions of the convex portions 121. The second impurity regions 122 include negative typed impurities (i.e., n-type impurities) providing holes. The n-type impurity may be phosphorus, arsenic or antimony. These may be used alone or in combination. The second impurity regions 122 are spaced apart from one another in the first and second directions.

Particularly, the n-type impurities are implanted into the upper portions of the convex portions 121 by using the first mask layer patterns 200, the first insulator patterns 500 and the second insulator patterns 700 together as a second ion implantation mask. Thus, second impurity regions 122 are formed at the upper portions of the convex portions 121. Here, the first impurity region 111 is spaced apart from the second impurity regions 122. In addition, bodies are formed between the first impurity region 111 and the second impurity regions 122.

In case that the preliminary semiconductor substrate 100a is doped with p-type impurities, the bodies formed between the first impurity region 111 and the second impurity regions 122 include p-type impurities.

Here, each of the bodies corresponds to two of first conductive layer patterns 400 horizontally. Thus, the semiconductor device of the present embodiment may have a channel substantially wider than those described in U.S. Pat. No. 5,907,170, U.S. Pat. No. 6,395,597 and U.S. Pat. No. 6,191,448. As a result, the semiconductor device of the present embodiment may have an operation speed substantially higher than those of U.S. Pat. No. 5,907,170, U.S. Pat. No. 6,395,597 and U.S. Pat. No. 6,191,448.

Figure 38:
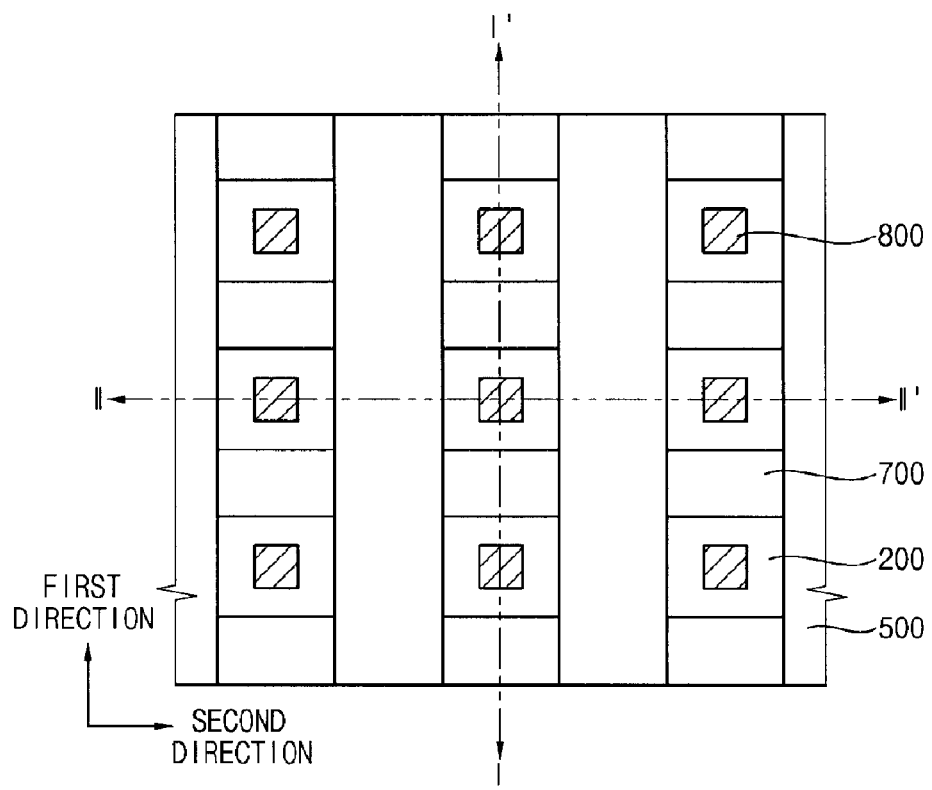
Figure 39:
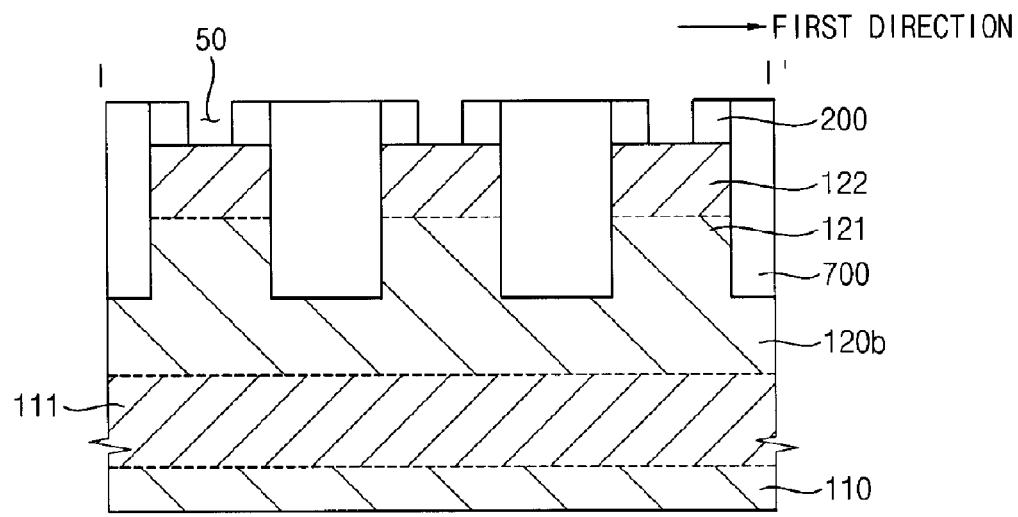
Figure 40:
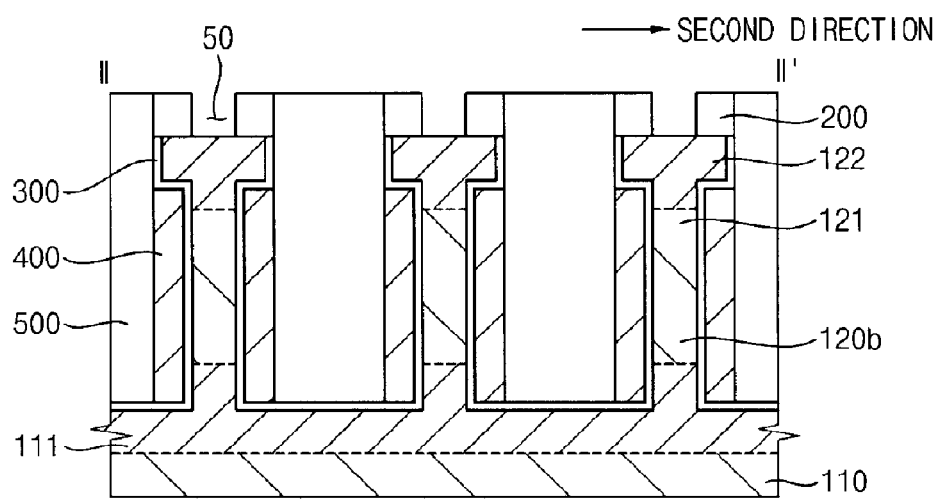

Referring to FIGS. 38 to 40, a conductor is formed on the first mask layer patterns 200, the first insulator patterns 500 and the second insulator patterns 700 to fill the first openings 50. Thereafter, the conductor is planarized until the first mask layer patterns 200, the first insulator patterns 500 and the second insulator patterns 700 are exposed so that contracts 800 may be formed in the first openings 50.

Figure 41:
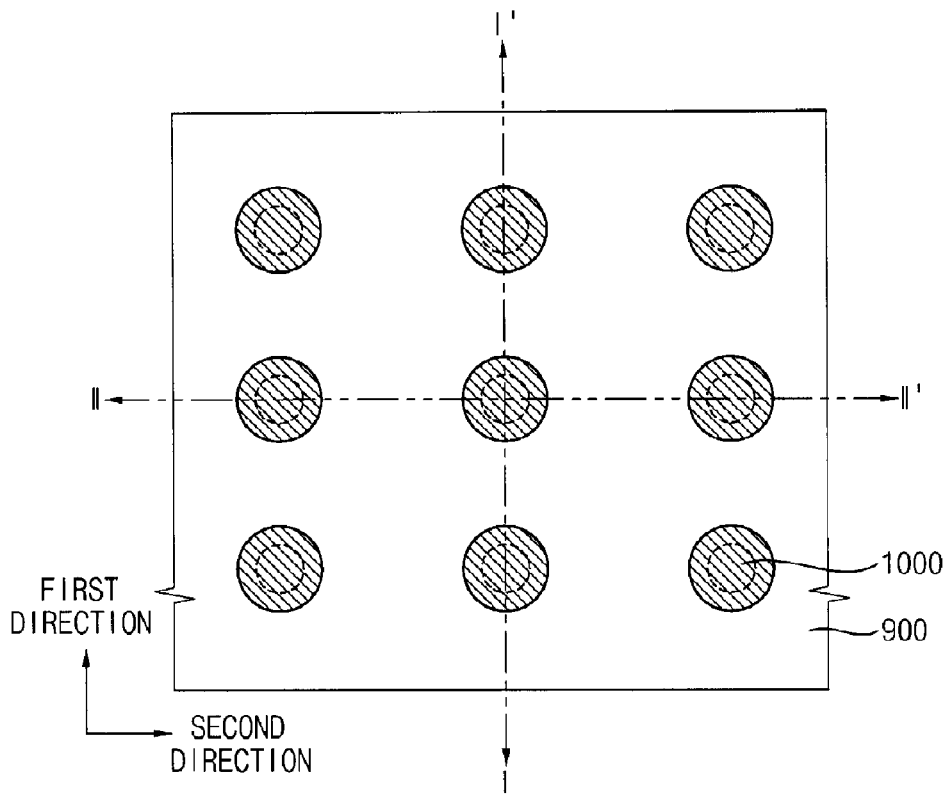
Figure 42:
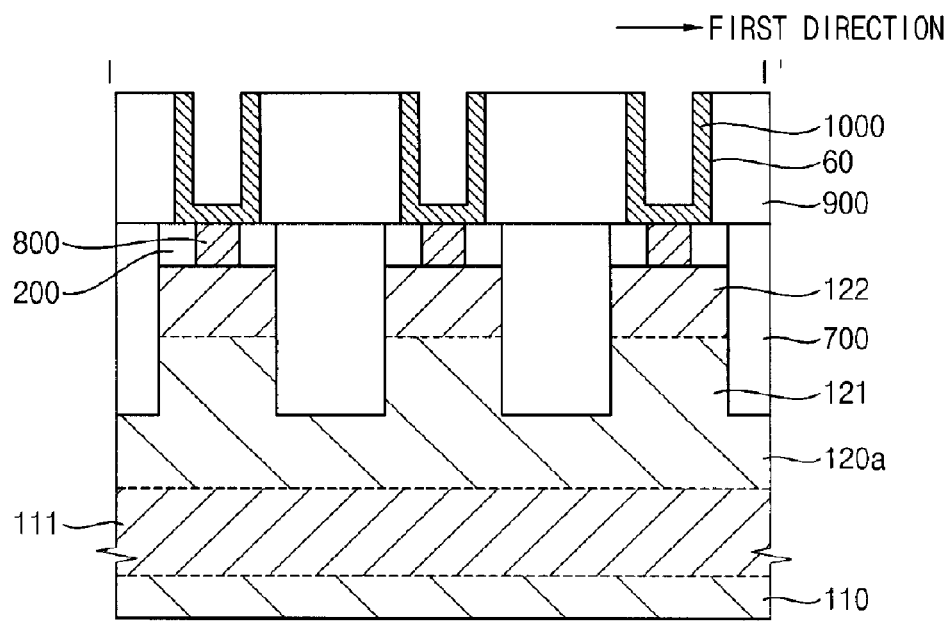
Figure 43:
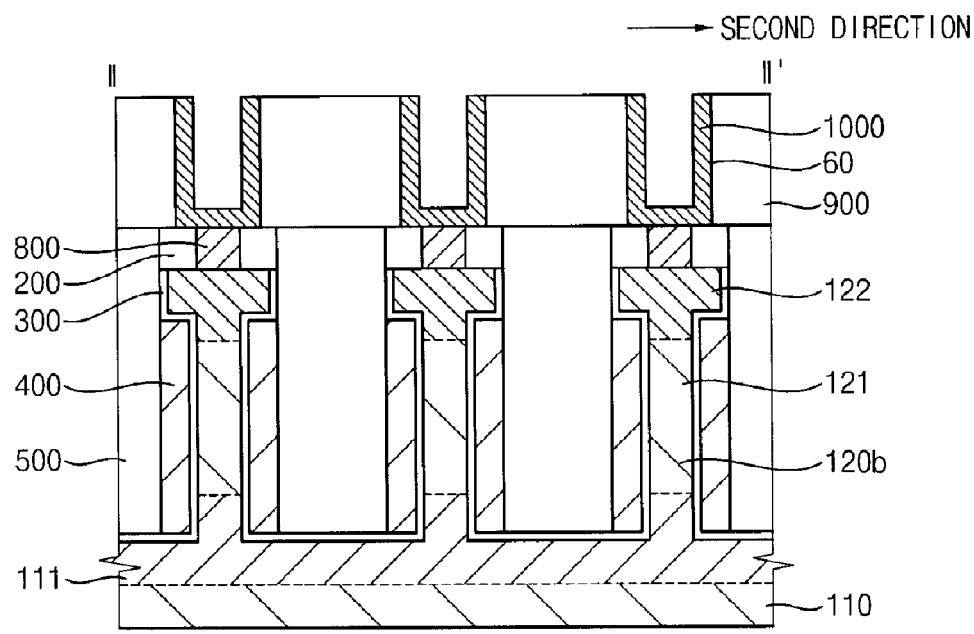

Referring to FIGS. 41 to 43, a mold layer 900 is formed on the first mask layer patterns 200, the first insulator patterns 500 and the second insulator patterns 700. The mold layer 900 has second openings 60 exposing the contacts 800 partially. Thereafter, a second conductive layer is formed on the mold layer 900 and the inner faces of the second openings 60. The second conductive layer has a substantially uniform thickness. A sacrificial layer is formed on the second conductive layer to fill up the second openings 60 partially filled with the second conductive layer. Thereafter, the sacrificial layer and the second conductive layer are planarized until the mold layer 800 is exposed so that second conductive layer patterns 1000 and sacrificial layer patterns may be formed. The sacrificial layer patterns are then removed. Here, the second conductive layer pattern 1000 corresponds to a lower electrode of a capacitor.

Figure 44:
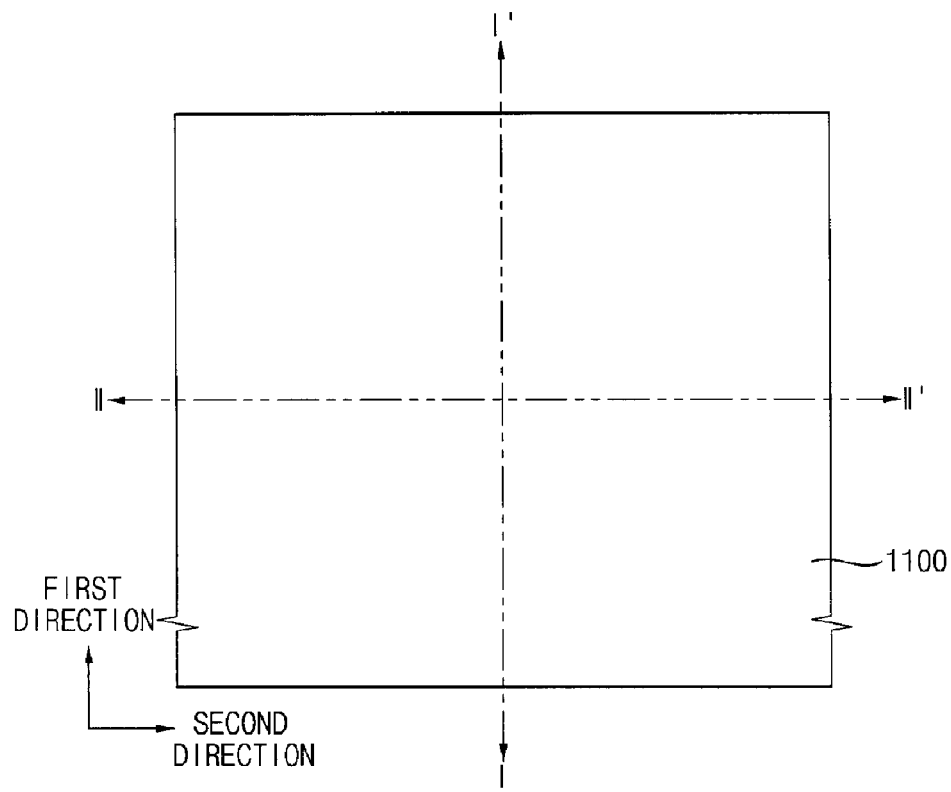
Figure 45:
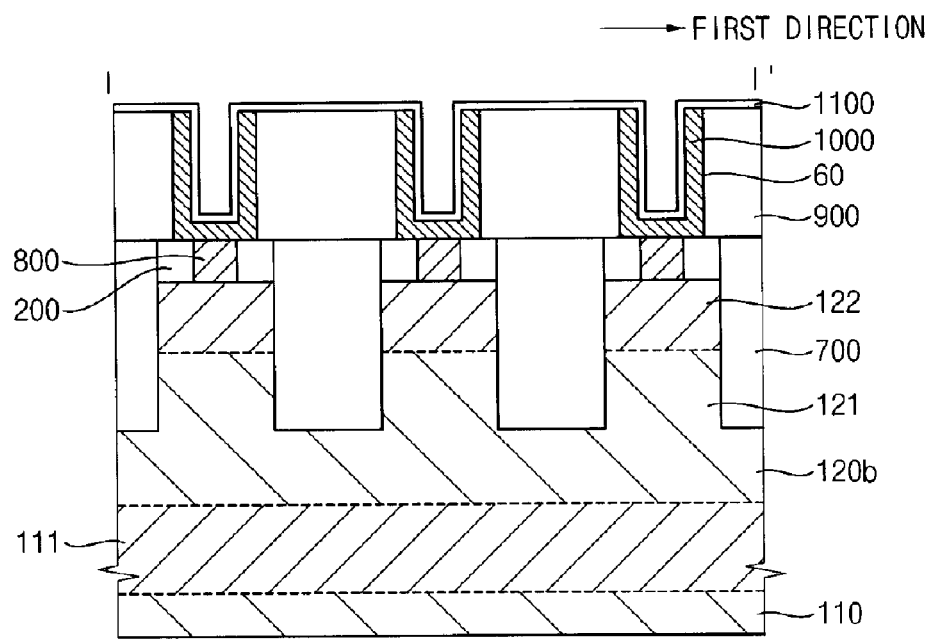
Figure 46:
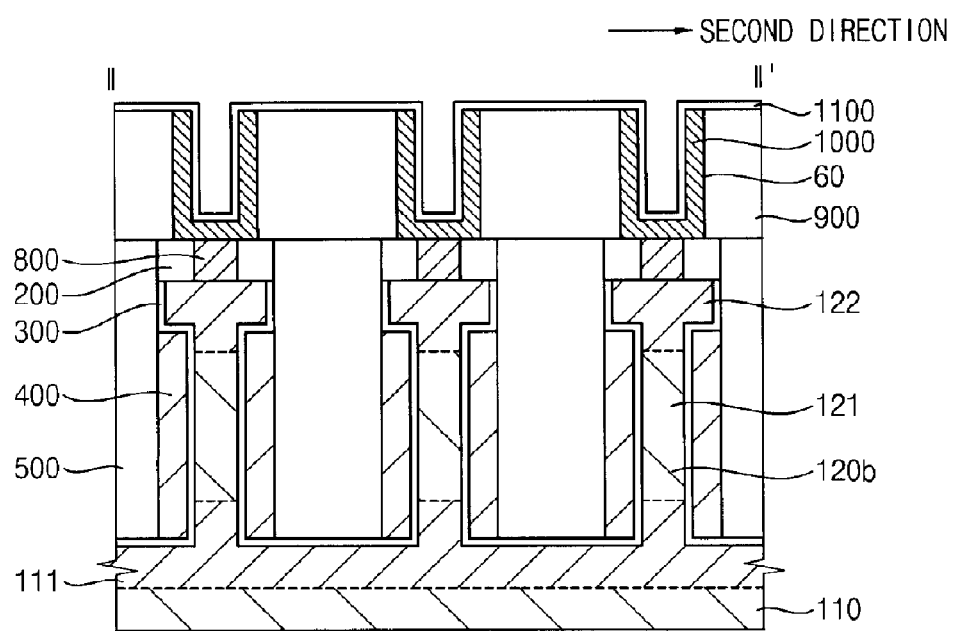

Referring to FIGS. 44 to 46, a second insulating layer 1100 is formed on the mold layer 900 and the second conductive layer patterns 1000. The second insulating layer 1100 has a substantially uniform thickness. That is, the second insulating layer 1100 substantially conforms to the mold layer 900 and the second conductive layer patterns 1000. The second insulating layer 1100 corresponds to a dielectric layer of the capacitor.

Figure 47:
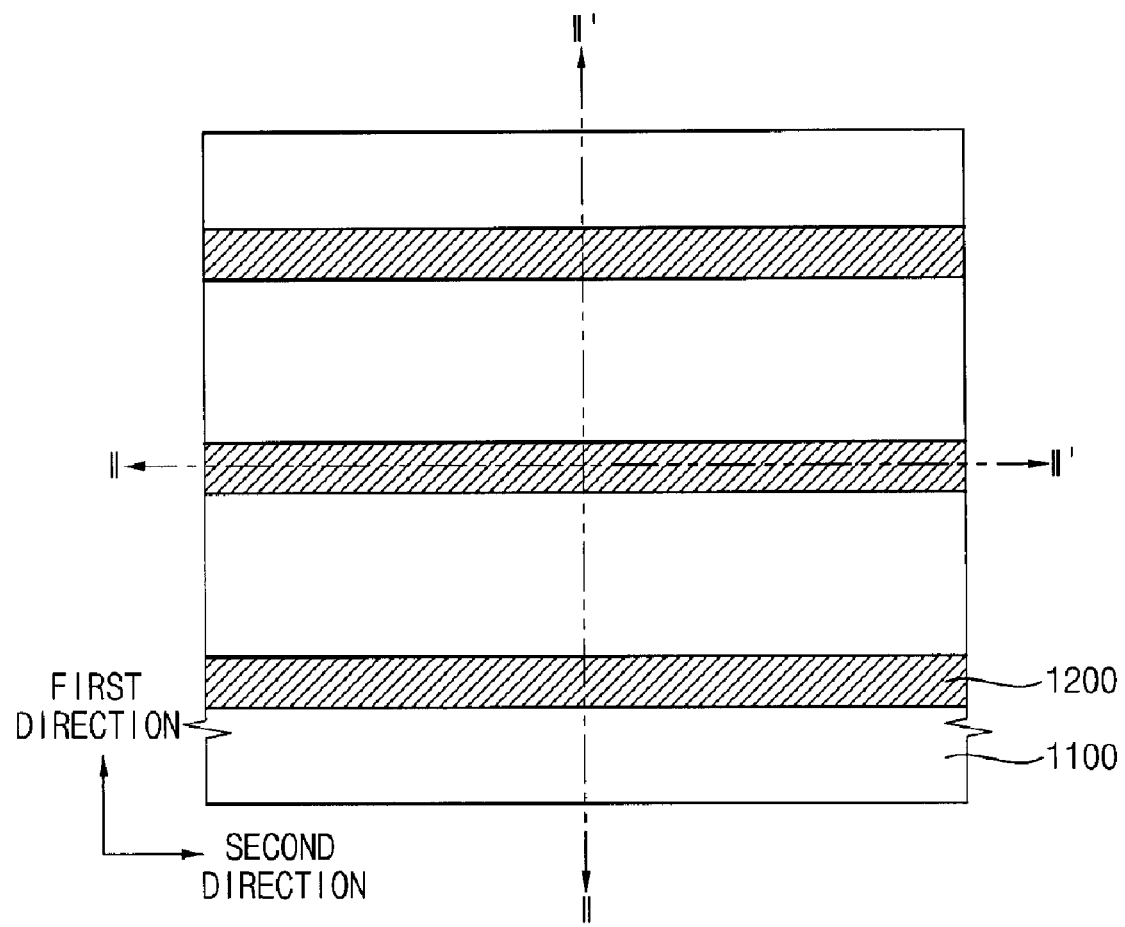
Figure 48:
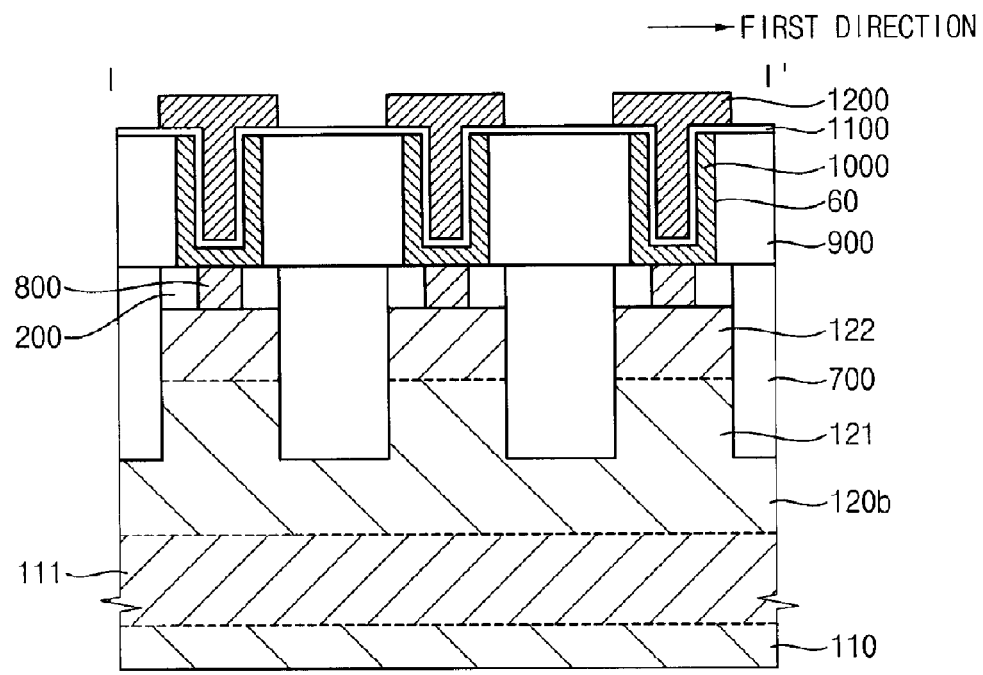
Figure 49:
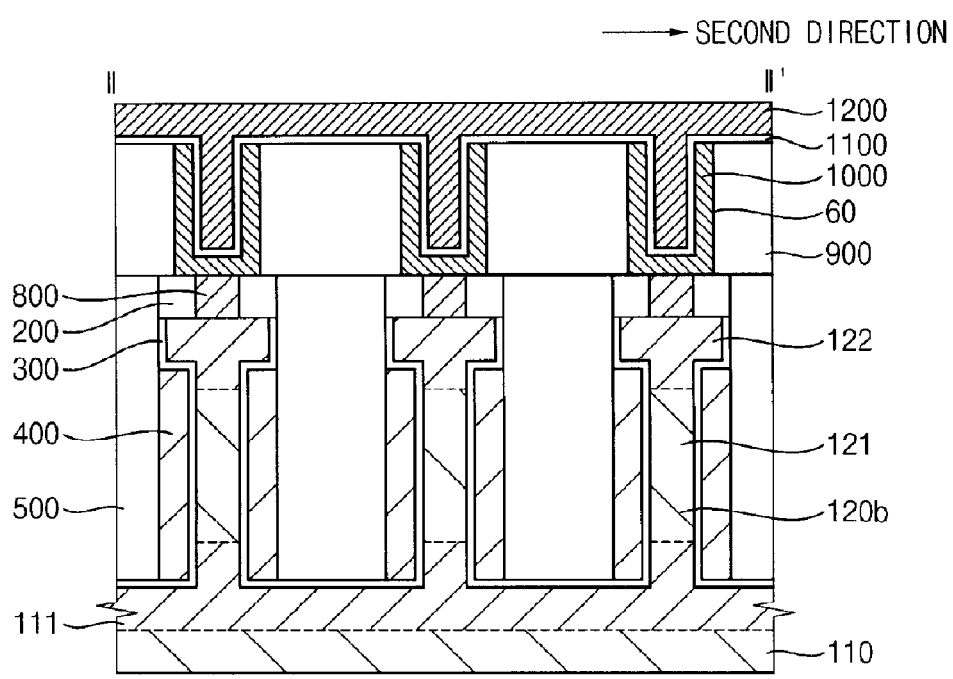

Referring to FIGS. 47 to 49, third conductive patterns 1200 are formed on the second insulating layer 1100. The third conductive layer patterns 1200 extend in the second direction. The third conductive layer patterns 1200 are spaced apart from one another in the first direction. The third conductive layer patterns 1200 fill up the second openings 60 partially filled with the first conductive layer patterns 1000 and the second insulating layer 1100. The third conductive layer 1200 corresponds to an upper electrode of the capacitor. In addition, the third conductive layer pattern 1200 corresponds to a bit line.

Here, a conductive member (See a reference numeral 15 in FIG. 4) may be further formed to connect the lower portions 120b of the protrusions 120 with one another. The conductive member may extend in the first direction. Here, the conductive member may connect the lower portions 120b of the protrusions 120 with one another. According to the present invention, a semiconductor device includes a body that is not isolated by source/drain regions. In addition, a width of a channel generated in the semiconductor device is great so that an operation speed of the semiconductor device may be relatively high. Because the source/drain regions may not isolate the body, an accumulation of holes in the body may be efficiently prevented. As a result, an operation failure of a semiconductor device due to the accumulation of the holes in the body may be reduced.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a semiconductor device, the method comprising:
   forming a semiconductor substrate including a base and protrusions, the protrusions extending in a first direction on the base, the protrusions being spaced apart from one another in a second direction substantially perpendicular to the first direction;
   forming first insulating layers on sidewalls of the protrusions;
   forming first conductive layer patterns on the first insulating layers;
   forming a first impurity region at an upper portion of the base;
   partially removing upper portions of the protrusions to form convex portions on lower portions of the protrusions, the convex portions being spaced apart from one another in the first and second directions; and
   forming second impurity regions at upper portions of the convex portions.

2. The method of claim 1, wherein the first and second impurity regions including substantially the same impurities.

3. The method of claim 2, wherein the impurities are n-type impurities.

4. The method of claim 1, wherein the semiconductor substrate is doped with p-type impurities.

5. The method of claim 1, further comprising:
   forming third conductive layer patterns electrically connected to the second impurity regions;
   forming a second insulating layer covering the third conductive layer patterns; and
   forming third conductive layer patterns on the second insulating layer, the third conductive layer patterns extending in the second direction, the third conductive layer patterns being spaced apart from one another in the first direction.

6. The method of claim 1, further comprising forming a conductive member electrically connected to the lower portions of the protrusions.

* * * * *